(12) United States Patent
Zhang et al.

(10) Patent No.: US 8,952,481 B2
(45) Date of Patent: Feb. 10, 2015

(54) SUPER SURGE DIODES

(71) Applicant: Cree, Inc., Durham, NC (US)

(72) Inventors: Qingchun Zhang, Cary, NC (US); Jennifer Duc, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/681,993

(22) Filed: Nov. 20, 2012

(65) Prior Publication Data

US 2014/0138705 A1 May 22, 2014

(51) Int. Cl.
*H01L 29/47* (2006.01)
*H01L 21/28* (2006.01)
*H01L 29/872* (2006.01)
*H01L 29/66* (2006.01)
*H01L 29/16* (2006.01)
*H01L 29/06* (2006.01)

(52) U.S. Cl.
CPC .......... *H01L 29/1608* (2013.01); *H01L 29/47* (2013.01); *H01L 29/872* (2013.01); *H01L 29/66053* (2013.01); *H01L 29/0619* (2013.01); *H01L 29/6606* (2013.01)
USPC .......................................... 257/471; 438/571

(58) Field of Classification Search
CPC ............ H01L 29/66143; H01L 29/872; H01L 29/407; H01L 29/0692; H01L 29/1608; H01L 29/6606; H01L 29/66053; H01L 29/0619; H01L 29/47
USPC ............ 257/77, 471, 472; 438/167, 570, 572, 438/576, 571
See application file for complete search history.

(56) References Cited

U.S. PATENT DOCUMENTS

| | | | |
|---|---|---|---|
| 6,897,133 B2 | 5/2005 | Collard | |
| 7,728,403 B2 | 6/2010 | Harris et al. | |
| 8,384,181 B2 | 2/2013 | Zhang et al. | |
| 2003/0057482 A1* | 3/2003 | Harada | 257/329 |
| 2004/0212011 A1* | 10/2004 | Ryu | 257/335 |
| 2008/0093637 A1 | 4/2008 | Sankin et al. | |
| 2008/0191304 A1 | 8/2008 | Zhang et al. | |
| 2011/0095301 A1 | 4/2011 | Tarui | |
| 2011/0215338 A1* | 9/2011 | Zhang | 257/73 |
| 2011/0248286 A1 | 10/2011 | Onose | |
| 2012/0115319 A1 | 5/2012 | Mieczkowski et al. | |
| 2013/0062723 A1 | 3/2013 | Henning et al. | |

FOREIGN PATENT DOCUMENTS

JP 2007042997 A 2/2007

OTHER PUBLICATIONS

Kirsten et al., "Deposition of thick polysilicon films with low stress in an epitaxial reactor for surface micromachining applications",1995, Thin Solid Films, vol. 259, pp. 181-187.*
Nakamura, T. et al., "Novel Developments Towards Increased SiC Power Device and Module Efficiency," presented at IEEE Energytech, May 29-31, 2012, Cleveland, Ohio, IEEE, pp. 1-6.
International Search Report for PCT/US2013/070982, mailed Jan. 30, 2014, 16 pages.

* cited by examiner

*Primary Examiner* — Nikolay Yushin
(74) *Attorney, Agent, or Firm* — Withrow & Terranova, P.L.L.C.

(57) ABSTRACT

The present disclosure relates to a semiconductor device having a Schottky contact that provides both super surge capability and low reverse-bias leakage current. In one preferred embodiment, the semiconductor device is a Schottky diode and even more preferably a Silicon Carbide (SiC) Schottky diode. However, the semiconductor device may more generally be any type of semiconductor device having a Schottky contact such as, for example, a Metal-Oxide-Semiconductor Field Effect Transistor (MOSFET).

29 Claims, 25 Drawing Sheets

SUPER SURGE DIODES

FIELD OF THE DISCLOSURE

The present disclosure relates to a Schottky diode.

BACKGROUND

A Schottky diode takes advantage of the metal-semiconductor junction, which provides a Schottky barrier and is created between a metal layer and a doped semiconductor layer. For a Schottky diode with an N-type semiconductor layer, the metal layer acts as the anode, and the N-type semiconductor layer acts as the cathode. In general, the Schottky diode acts like a traditional p-n diode by readily passing current in the forward-biased direction and blocking current in the reverse-biased direction. The Schottky barrier provided at the metal-semiconductor junction provides two unique advantages over p-n diodes. First, the Schottky barrier is associated with a lower barrier height, which correlates to lower forward voltage drops. As such, a smaller forward voltage is required to turn on the device and allow current to flow in a forward-biased direction. Second, the Schottky barrier generally has less capacitance than a comparable p-n diode. The lower capacitance translates to higher switching speeds than p-n diodes. Schottky diodes are majority carrier devices and do not exhibit minority carrier behavior which results in switching losses.

SUMMARY

The present disclosure relates to a semiconductor device having a Schottky contact that provides both super surge capability and low reverse-bias leakage current. In one preferred embodiment, the semiconductor device is a Schottky diode and even more preferably a Silicon Carbide (SiC) Schottky diode. However, the semiconductor device may more generally be any type of semiconductor device having a Schottky contact such as, for example, a Metal-Oxide-Semiconductor Field Effect Transistor (MOSFET).

In one embodiment, the semiconductor device includes a drift layer of a first conductivity type, where the drift layer includes a number of junction barrier shield element recesses in a first surface of the drift layer within an active region of the drift layer and a number of implant regions that are of a second conductivity type that is opposite the first conductivity type and extend into the drift layer from corresponding junction barrier element recesses. The semiconductor device also includes an epitaxial surge current injection region on the first surface of the drift layer adjacent to the junction barrier element recesses, where the epitaxial surge current injection region is highly doped of the second conductivity type. Further, the semiconductor device includes a Schottky layer on the first surface of the drift layer to form a Schottky junction between the Schottky layer and the drift layer. The Schottky layer extends over the junction barrier element recesses such that the implant regions extending from the junction barrier element recesses form an array of junction barrier regions in the drift layer below the Schottky junction. The epitaxial surge current injection region provides super surge capability while the implant regions extending from the junction barrier element recesses result in low reverse-bias leakage current.

In another embodiment, the semiconductor device includes a drift layer of a first conductivity type. The semiconductor device also includes a number of epitaxial junction barrier shield regions located within corresponding recesses in a first surface of the drift layer, wherein the epitaxial junction barrier shield regions are highly doped of a second conductivity type that is opposite the first conductivity type. Further, the semiconductor device includes a Schottky layer on the first surface of the drift layer to form a Schottky junction between the Schottky layer and the drift layer, where the Schottky layer extends over the epitaxial junction barrier shield regions such that the epitaxial junction barrier shield regions form an array of junction barrier shield regions in the drift layer below the Schottky junction. The epitaxial junction barrier shield regions provide both super surge capability and low reverse-bias leakage current.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
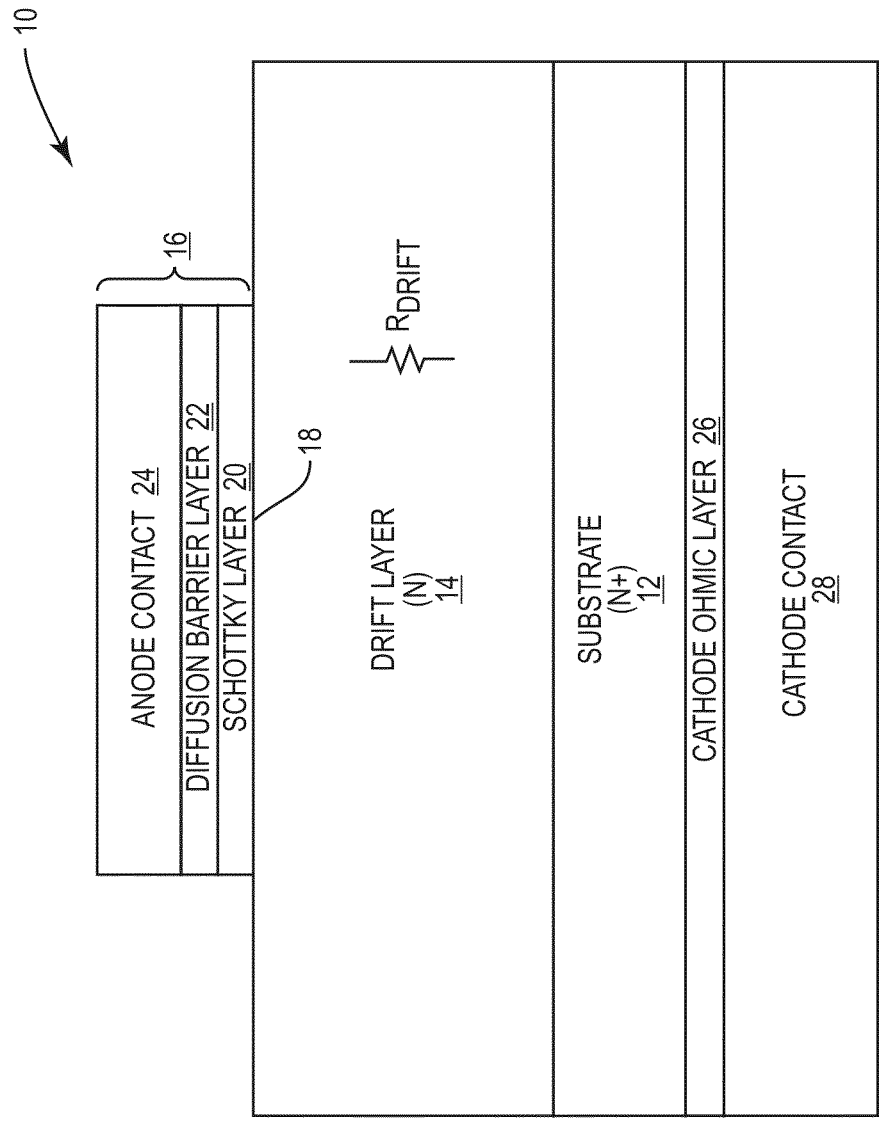
FIG. 1 illustrates a Schottky diode.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

There is a need for a Schottky diode having super surge capabilities (e.g., a Schottky diode that can handle at least ten times a rated current of the Schottky diode). A conventional Schottky diode does not have super surge capability. More specifically, in a conventional Schottky diode, a differential on-resistance of the Schottky diode increases with voltage and temperature. Therefore, under surge conditions, small changes in forward current result in relatively large increases in forward voltage and, as a result, small increases in forward current result in relatively large increases in power. As a result, under a super surge condition, the conventional Schottky diode experiences a power density that far exceeds a maximum power density that can be handled by the Schottky diode. In addition, the conventional Schottky diode suffers from high reverse-bias leakage current.

The present disclosure relates to a semiconductor device having a Schottky contact that provides both super surge capability and low reverse-bias leakage current. In one preferred embodiment, the semiconductor device is a Schottky diode and even more preferably a Silicon Carbide (SiC) Schottky diode. However, the semiconductor device may more generally be any type of semiconductor device having a Schottky contact such as, for example, a Metal-Oxide-Semiconductor Field Effect Transistor (MOSFET).

Before specifically describing embodiments of a semiconductor device having both super surge capability and low reverse-bias leakage current according to the present disclosure, a discussion is provided of research conducted by the inventors that will enable better understanding of the semiconductor devices disclosed herein. FIG. 1 illustrates a conventional Schottky diode 10. The Schottky diode 10 does not have super surge capability and has high reverse-bias leakage current. As illustrated, the Schottky diode 10 includes a substrate 12, a drift layer 14 on a surface of the substrate 12, and a Schottky contact 16 on a surface of the drift layer 14 opposite the substrate 12 to thereby form a Schottky junction 18 between the drift layer 14 and the Schottky contact 16. The area of the drift layer 14 below the Schottky contact 16 is referred to herein as an active area of the drift layer 14 or an active area of the Schottky diode 10. In this example, the substrate 12 and the drift layer 14 are both N-type, where the substrate 12 is highly doped (e.g., greater than or equal to $1\times10^{19}$ cm$^{-3}$) and the drift layer 14 is relatively lightly doped (e.g., between about $2\times10^{15}$ cm$^{-3}$ and $1\times10^{16}$ cm$^{-3}$). For illustrative purposes, assume that the substrate 12 and the drift layer 14 are each formed of SiC. However, other semiconductor materials may be used.

The Schottky contact 16 includes a Schottky layer 20 on the surface of the drift layer 14, a diffusion barrier layer 22 on a surface of the Schottky layer 20 opposite the drift layer 14, and an anode contact 24 on a surface of the diffusion barrier layer 22 opposite the Schottky layer 20. The diffusion barrier layer 22 is optional and may be included to prevent materials from one of the Schottky layer 20 and the anode contact 24 from diffusing into the other. Lastly, the Schottky diode 10 includes a cathode ohmic layer 26 on a second surface of the substrate 12 opposite the drift layer 14 and a cathode contact 28 on a surface of the cathode ohmic layer 26 opposite the substrate 12. The cathode ohmic layer 26 is optional and may be provided between the substrate 12 and the cathode contact 28 to facilitate a low impedance coupling therebetween.

Figure 2:
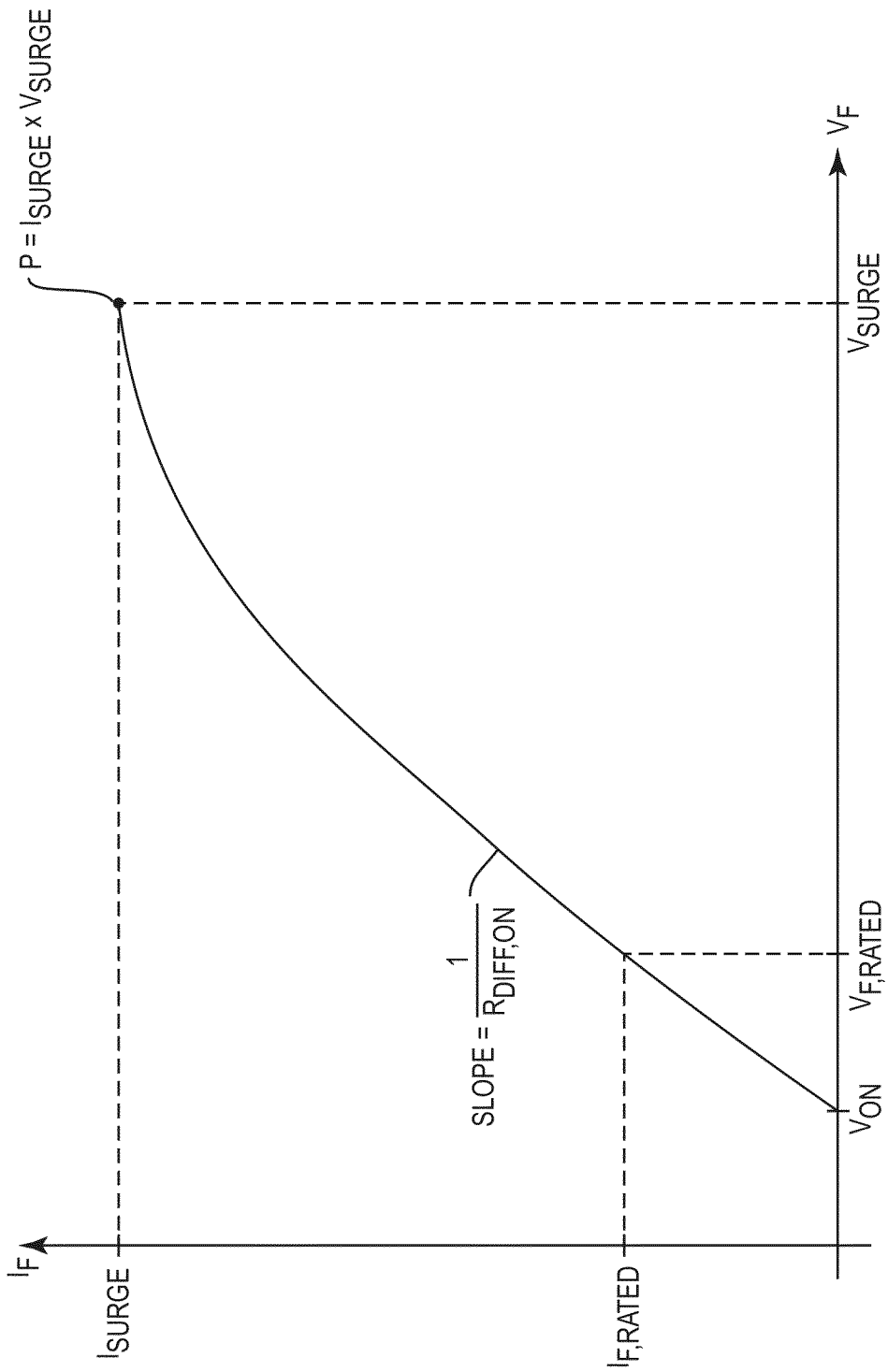
FIG. 2 is a graph of forward current versus forward voltage for the Schottky diode of FIG. 1 that illustrates that the Schottky diode does not have super surge capability.

FIG. 2 is a diagram of a forward current ($I_F$) versus forward voltage ($V_F$) characteristic of the Schottky diode 10 of FIG. 1. As illustrated, when the forward voltage ($V_F$) reaches a turn-on voltage ($V_{ON}$) of the Schottky diode 10 (i.e., a turn-on voltage of the Schottky junction 18 between the Schottky layer 20 and the drift layer 14), the Schottky diode 10 begins to conduct current. From that point up until the forward current ($I_F$) reaches a rated current ($I_{F,RATED}$), the forward current ($I_F$) increases as a substantially linear function of the forward voltage ($V_F$). However, under surge condition where $I_F > I_{F,RATED}$, a differential on-resistance ($R_{DIFF,ON}$) of the Schottky diode 10 increases as a function of forward voltage ($V_F$). More specifically, the differential on-resistance ($R_{DIFF,}$ $_{ON}$) is primarily dependent on a resistance of the drift layer 14 ($R_{DRIFT}$), and the resistance of the drift layer 14 ($R_{DRIFT}$) is inversely proportional to a carrier mobility of the drift layer 14. The carrier mobility of the drift layer 14 decreases with increasing forward voltage ($V_F$) and temperature. Since both the forward voltage ($V_F$) and the temperature of the Schottky diode 10 increase under surge condition, the carrier mobility of the drift layer 14 decreases, which in turn increases the resistance of the drift layer 14 ($R_{DRIFT}$) and thus the differential on-resistance ($R_{DIFF,ON}$) of the Schottky diode 10. As a result, under a super surge condition where $I_F = 10 \cdot I_{F,RATED}$, the power consumed by the Schottky diode 10 is equal to the product of the forward current ($I_F$) and the forward voltage ($V_F$) at the super surge condition. The forward current ($I_F$) under a surge condition (e.g., a super surge condition) is referred to herein as a surge current ($I_{SURGE}$) and the corresponding forward voltage ($V_F$) is referred to herein as a surge voltage ($V_{SURGE}$). As an example of the super surge condition, if the rated current ($I_{F,RATED}$) is 5 Amperes (A) and $V_{SURGE}$ for the super surge condition is 20 Volts (V), then the power consumed by the Schottky diode 10 under the super surge condition is 1,000 Watts (W), which would destroy the circuit package in which the Schottky diode 10 is implemented. Therefore, it is clear that the Schottky diode 10 does not have super surge capabilities.

Figure 3:
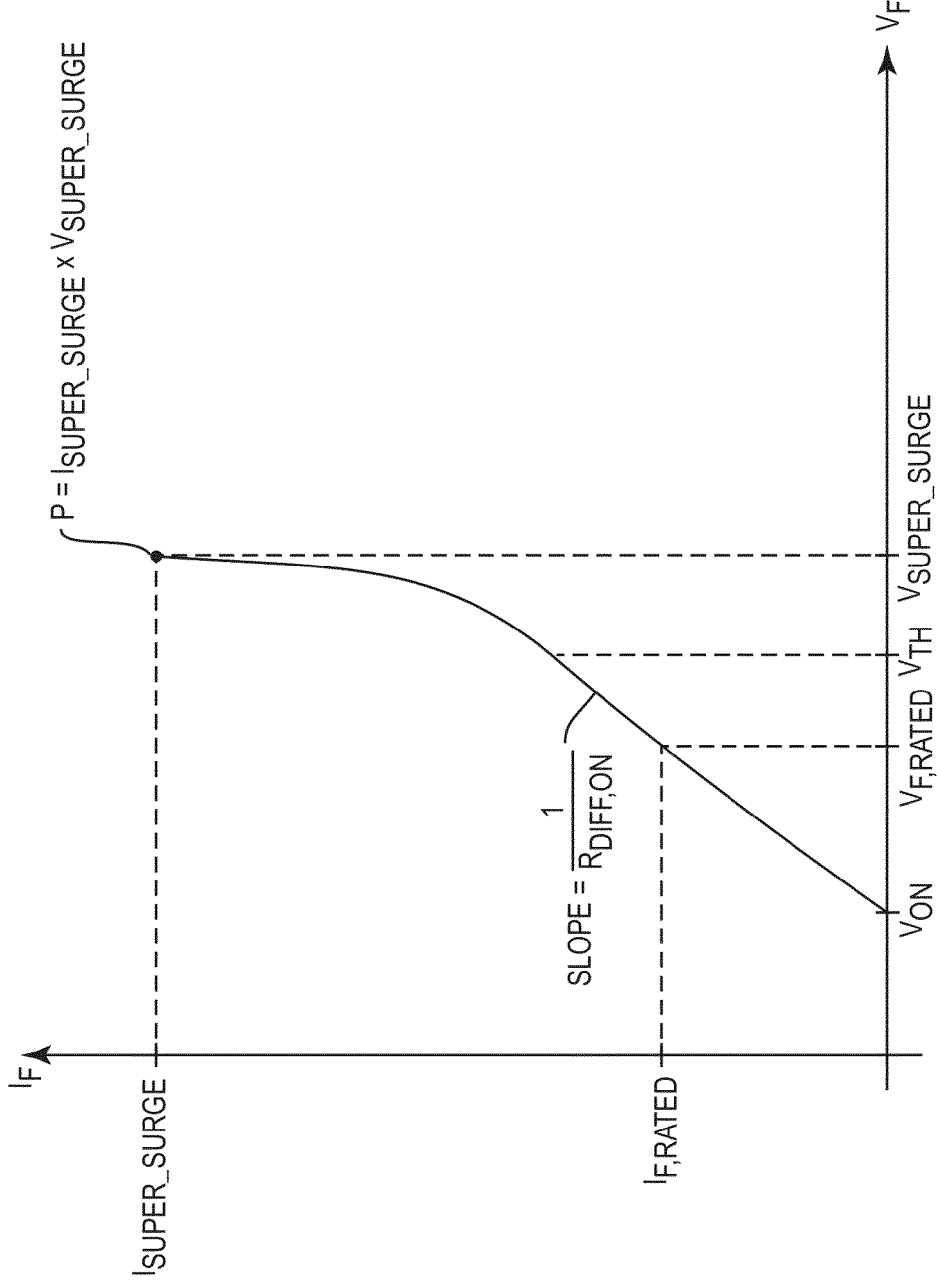
FIG. 3 is a desired forward current versus forward voltage characteristic for a Schottky diode that has super surge capability.

In comparison, FIG. 3 illustrates a forward current ($I_F$) versus forward voltage ($V_F$) characteristic for a desired Schottky diode having super surge capability. As illustrated, in order to have super surge capability, it is desirable for a differential on-resistance ($R_{DIFF,ON}$) of the desired Schottky diode to decrease under surge conditions. Specifically, as illustrated, it is desirable for the differential on-resistance ($R_{DIFF,ON}$) to decrease as the forward voltage ($V_F$) increases beyond a predetermined voltage ($V_{TH}$) that is indicative of a surge condition. The predetermined voltage ($V_{TH}$) is generally a voltage that is greater than or equal to a rated forward voltage ($V_{F,RATED}$) and less than a desired forward voltage ($V_F$) under super surge conditions. As a result, under a super surge condition where $I_F = 10 \sim I_{F,RATED}$, the forward voltage ($V_F$) under the super surge condition is substantially less than that of FIG. 2. Note that in FIG. 3 the forward current under the super surge condition is denoted as "$I_{SUPER\_SURGE}$" and the corresponding forward voltage is denoted as "$V_{SUPER\_SURGE}$." By decreasing the differential on-resistance ($R_{DIFF,ON}$) when the forward voltage ($V_F$) is greater than the predetermined voltage ($V_{TH}$), the forward voltage ($V_F$) of the desired Schottky diode is effectively clamped at a suitable voltage level. As a result, the power consumed by the desired Schottky diode under super surge conditions is significantly less than the power consumed by the Schottky diode 10 of FIG. 1. For example, if the rated current ($I_{RATED}$) is 5 A and $V_{SURGE}$ is 5 V under the super surge condition, then the power consumed by the Schottky diode 10 under the super surge condition is 250 W.

The inventors have found that decreasing the differential on-resistance ($R_{DIFF,ON}$) of the desired Schottky diode under surge conditions requires conductivity modulation. More specifically, a Schottky diode is normally a majority carrier device (i.e., there is only one type of carrier, namely, electrons or holes but not both). What is needed is a Schottky diode that, under surge conditions, has both majority and minority carriers (i.e., both electrons and holes carry the current). In this manner, the differential on-resistance ($R_{DIFF,ON}$) of the desired Schottky diode can be decreased under surge conditions. With the decreasing differential on-resistance ($R_{DIFF,ON}$), the desired Schottky diode can handle increasing forward current ($I_F$) under a super surge condition with little increase in the forward voltage ($V_F$), which in turn significantly reduces the power consumed by the desired Schottky diode under the super surge condition.

Figure 4:
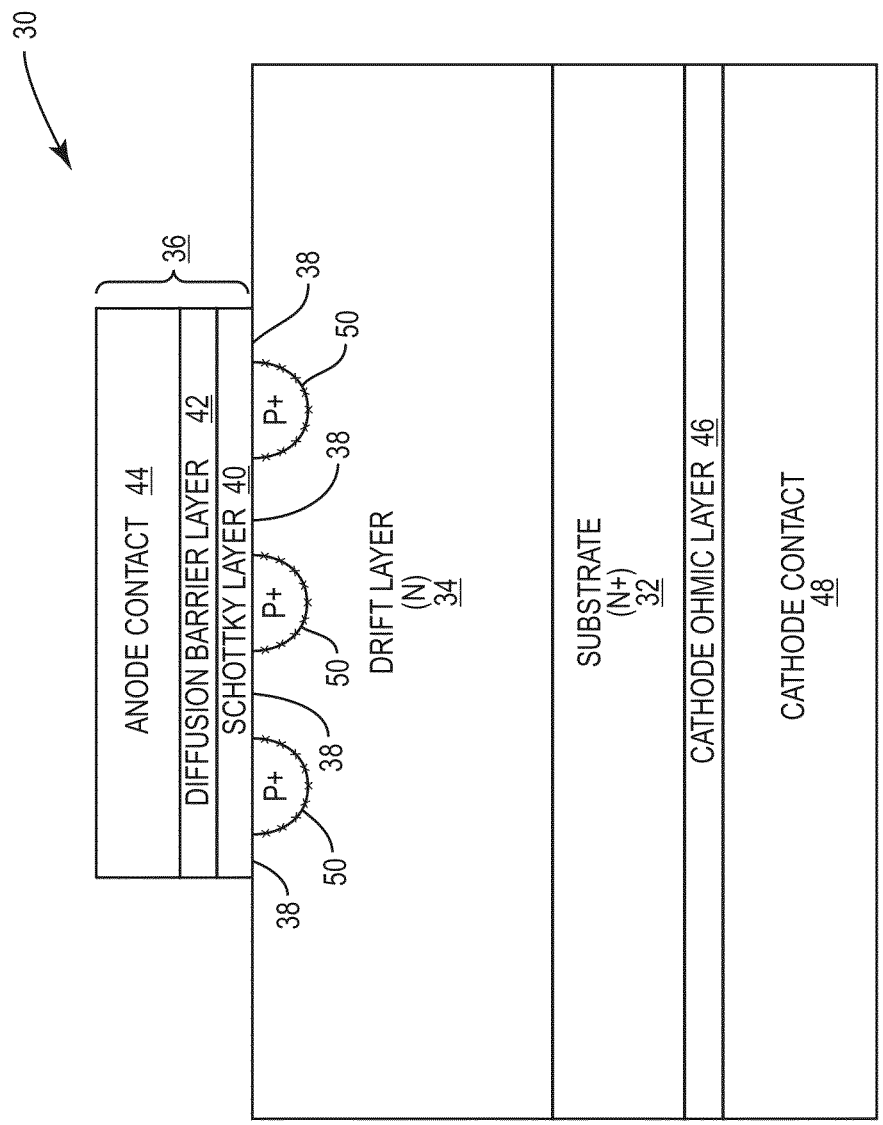
FIG. 4 illustrates a Schottky diode that has some surge capability but that does not have super surge capability.

FIG. 4 illustrates a Schottky diode 30 designed to reduce reverse-leakage current that also has some surge capabilities. However, for the reasons discussed below, the inventors have found that the Schottky diode 30 does not have super surge capability. As illustrated, the Schottky diode 30 includes a substrate 32; a drift layer 34; a Schottky contact 36 that includes a Schottky layer 40 that forms a Schottky junction 38 with the drift layer 34, a diffusion barrier layer 42, and an anode contact 44; optionally a cathode ohmic layer 46; and a cathode contact 48 in the same manner as described above with respect to the Schottky diode 10 of FIG. 1. However, the Schottky diode 30 also includes highly doped implant regions 50, which are referred to herein as implanted junction barrier shield (JBS) regions 50, beneath the Schottky contact 36 in the active region of the Schottky diode 30. As described in commonly owned and assigned U.S. Patent Application Publication No. 2008/0191304, under reverse-bias conditions, a depletion region forms around the implanted JBS regions 50 to shield the Schottky junction 38 from high electronic fields to which the Schottky junction 38 would otherwise be exposed. As a result, reverse-bias leakage current is significantly reduced.

The implanted JBS regions 50 also provide conductivity modulation under surge conditions. However, hole injection efficiency of the implanted JBS regions 50 is low due to implant damage, which is illustrated by hashing around the edges of the implanted JBS regions 50. This implant damage results in reduced lifetime of holes injected into the drift layer 34 from the implanted JBS regions 50. Since the resistance of the drift layer 34 is dependent on the lifetime of the holes injected into the drift layer 34 from the implanted JBS regions 50, the implanted JBS regions 50 provide poor conductivity modulation when operating under surge conditions.

Figure 5:
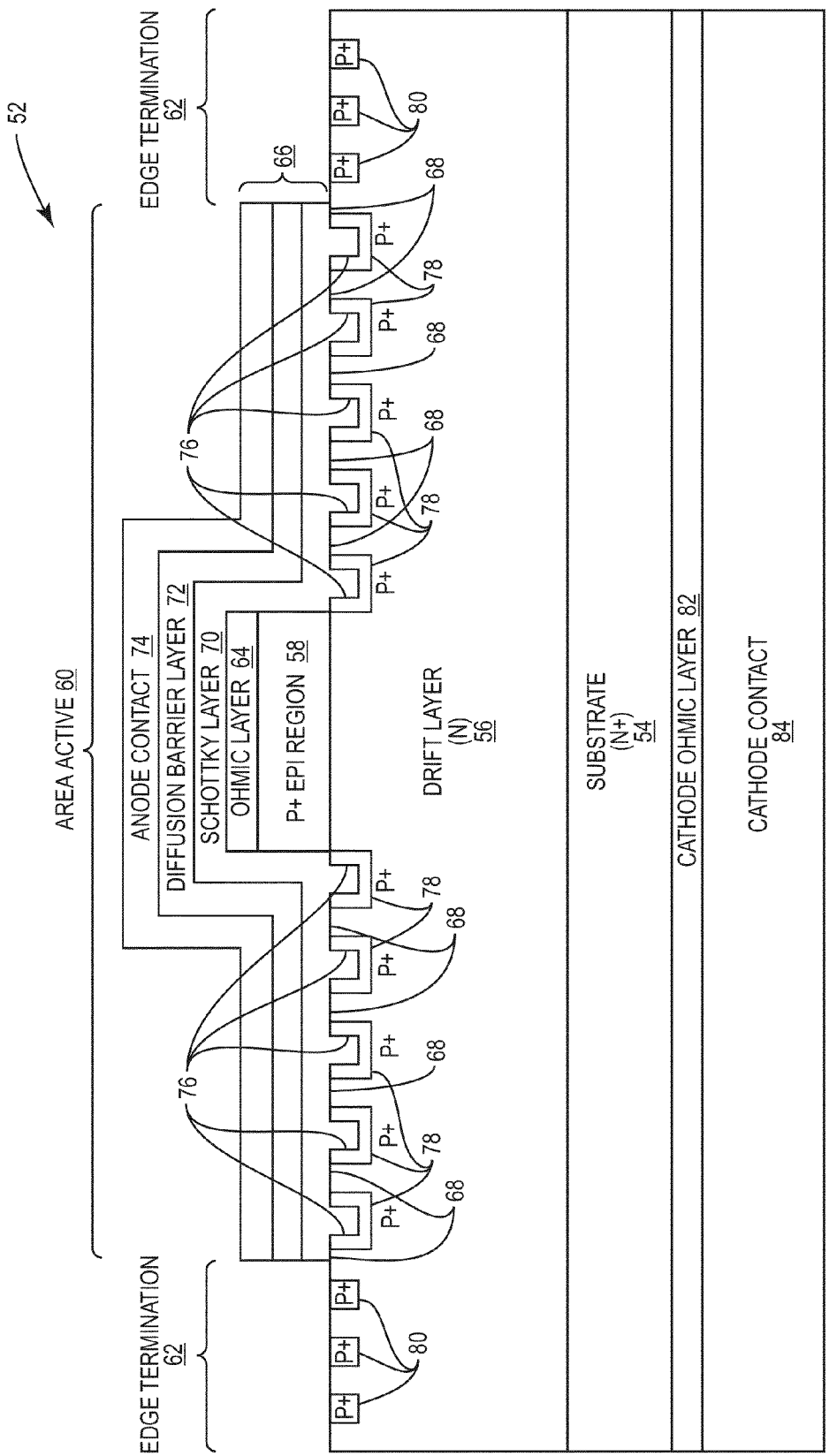
FIG. 5 illustrates a Schottky diode having both super surge capability and low reverse-bias leakage current according to one embodiment of the present disclosure.

Now, the description will turn to embodiments of a Schottky diode that has super surge capability, and preferably both super surface capability and low reverse-bias leakage current. As used herein, a "super surge capability" is a surge capability that is better than the surge capability of the Schottky diode 30 of FIG. 4. In this regard, FIG. 5 illustrates a Schottky diode 52 having both super surge capability and low reverse-bias leakage current according to one embodiment of the present disclosure. As illustrated, the Schottky diode 52 includes a substrate 54 and a drift layer 56 on a surface of the substrate 54. In this embodiment, the substrate 54 and the drift layer 56 are both N-type, where the substrate 54 is highly doped and the drift layer 56 is relatively lightly doped. Further, for illustrative purposes, assume that the substrate 54 and the drift layer 56 are each formed of SiC. However, other semiconductor materials may be used.

The Schottky diode 52 also includes an epitaxial, or epi, region 58 on a surface of the drift layer 56 opposite the substrate 54 in an active area 60 of the Schottky diode 52. Notably, the active area 60 is at least partially, but preferably completely, surrounded by an edge termination 62. In this embodiment, the epi region 58 is a P+ epi region 58 and is also referred to herein as an epitaxial surge current injection region. As discussed below in detail, the P+ epi region 58 operates to inject holes into the drift layer 56 when the Schottky diode 52 is operating under surge conditions to thereby decrease a differential on-resistance of the Schottky diode 52 via conductivity modulation. Since the P+ epi region 58 is epitaxially grown on the surface of the drift layer 56, the P+ epi region 58 does not suffer from the implant damage discussed above with respect to the implanted JBS regions 50 of the Schottky diode 30 of FIG. 4. As a result, the conductivity modulation provided by the P+ epi region 58 is significantly better than that provided by the implanted JBS regions 50 of the Schottky diode 30, which in turn enables super surge capability. In this embodiment, an ohmic layer 64 is provided on a surface of the P+ epi region 58 to provide a low-resistance contact to the P+ epi region 58.

The Schottky diode 52 also includes a Schottky contact 66 on the surface of the drift layer 56 opposite the substrate 54 and extending over the surface of the ohmic layer 64 opposite the P+ epi region 58. The Schottky contact 66 forms a Schottky junction 68 between the drift layer 56 and the Schottky contact 66. The area of the drift layer 56 below the Schottky contact 66 is referred to herein as the active area 60 of the drift layer 56 and thus the active area 60 of the Schottky diode 52. The Schottky contact 66 includes a Schottky layer 70 on the surface of the drift layer 56, a diffusion barrier layer 72 on a surface of the Schottky layer 70 opposite the drift layer 56, and an anode contact 74 on a surface of the diffusion barrier layer 72 opposite the Schottky layer 70. The Schottky layer 70 forms the Schottky junction 68 between the Schottky layer 70 and the drift layer 56. The diffusion barrier layer 72 is optional and may be included to prevent materials from one of the Schottky layer 70 and the anode contact 74 from diffusing into the other.

Beneath the Schottky contact 66, a number of JBS element recesses 76 are in the surface of the drift layer 56 adjacent to the P+ epi region 58. Implanted JBS regions 78 extend from the JBS element recesses 76. In this embodiment, since the drift layer 56 is N-type, the implanted JBS regions 78 are highly doped P-type implant regions. The implanted JBS regions 78 form an array of JBS regions beneath the Schottky contact 66 and operate to protect the Schottky junction 68 from high localized electric fields under reverse-bias conditions, which in turn reduces a reverse-bias leakage current of the Schottky diode 52. Notably, while in this embodiment there are five JBS element recesses 76 and five corresponding implanted JBS regions 78 on each side of the P+ epi region 58, the Schottky diode 52 is not limited thereto. Depending on the particular layout and the particular implementation, there may be any number of two or more JBS element recesses 76 and two or more corresponding implanted JBS regions 78 adjacent to one or both sides of the P+ epi region 58.

Importantly, etching of a P+ epitaxial layer to form the P+ epi region 58 damages the surface of the drift layer 56. This damage results in a high localized electric field at the Schottky junction 68. In order to protect the Schottky junction 68 from this high localized electric field, a desired depth for the implanted JBS regions 78 is greater than the depth of the implanted JBS regions 50 of the Schottky diode 30 of FIG. 4. For example, for SiC, the desired depth for the implanted JBS regions 78 may be in a range of and including 0.5 to 1 micron, as compared to 0.2 to 0.3 microns for the implanted JBS regions 50 of the Schottky diode 30 of FIG. 4. Particularly for SiC, implanting to a depth of 0.5 to 1 microns would normally require a high energy implant, which is costly and results in increased implant damage. By forming the JBS element recesses 76 in the surface of the drift layer 56 and then implanting the implanted JBS regions 78 into the JBS element recesses 76, the desired depth for the implanted JBS regions 78 can be achieved without the need for a high energy implant. In one particular embodiment, the desired depth for the implanted JBS regions 78 is in a range of and including 0.5 to 1 microns, the depth of the JBS element recesses 76 is in a range of and including 0.3 to 0.8 microns, and the additional depth of the implanted JBS regions 78 is 0.2 to 0.3 microns to give the desired (total) depth of 0.5 to 1 micron. However, the depth of the JBS element recesses 76 and the additional depth of the implanted JBS regions 78 may vary depending on the particular implementation and material used for the drift layer 56. More generally, in one embodiment, the depth of the JBS element recesses 76 is greater than or equal to 0.1 microns. In another embodiment, the depth of the JBS element recesses 76 is greater than or equal to 0.3 microns. In another embodiment, the depth of the JBS element recesses 76 is greater than or equal to 0.5 microns.

The edge termination 62 includes, in this embodiment, a number of P+ guard rings 80 that at least partially, but preferably completely, surround the active area 60. Lastly, the Schottky diode 52 includes a cathode ohmic layer 82 on a second surface of the substrate 54 opposite the drift layer 56 and a cathode contact 84 on a surface of the cathode ohmic layer 82 opposite the substrate 54. The cathode ohmic layer 82 is optional and may be provided between the substrate 54 and the cathode contact 84 to facilitate a low impedance coupling therebetween.

During operation, as the Schottky diode 52 is forward-biased, the Schottky junction 68 turns on before the p-n junction between the P+ epi region 58 and the drift layer 56 and the p-n junctions between the implanted JBS regions 78 and the drift layer 56. At low forward voltages, current transport in the Schottky diode 52 is dominated by majority carriers (electrons) injected across the Schottky junction 68. As such, the Schottky diode 52 acts like a traditional Schottky diode. In this configuration, there is little or no minority carrier injection, and thus no minority charge. As a result, the Schottky diode 52 is capable of fast switching speeds at normal operating voltages.

When under a surge condition at which the forward voltage of the Schottky diode 52 reaches a predetermined threshold voltage, the p-n junction between the P+ epi region 58 and the drift layer 56 (and potentially the p-n junctions between the implanted JBS regions 78 and the drift layer 56) turns on. As a result, minority carriers (holes) are injected from the P+ epi region 58 into the drift layer 56, which in turn decreases the differential on-resistance of the Schottky diode 52 via conductivity modulation. Since the P+ epi region 58 is epitaxially grown, the P+ epi region 58 does not suffer from implant damage and, therefore, a lifetime of the holes injected from the P+ epi region 58 and thus the conductivity modulation is significantly improved. The conductivity modulation provided by the holes injected by the P+ epi region 58 causes a resistance of the drift layer 56, and thus a differential on-resistance of the Schottky diode 52, to decrease, which in turn significantly reduces power consumed by the Schottky diode 52 during surge conditions. Specifically, in the preferred embodiment, by reducing the differential on-resistance of the Schottky diode 52 during surge conditions, the Schottky diode 52 has super surge capability. In one embodiment, the Schottky diode 52 is capable of conducting at least 10 times a rated current of the Schottky diode 52 while consuming less than 300 W/cm$^2$.

In addition, as discussed above, the Schottky diode 52 has low reverse-bias leakage current due to the implanted JBS regions 78. While what is considered a "low" leakage current may vary, in one embodiment, the reverse-bias leakage current is less than or equal to about 1 mA/cm$^2$. When the Schottky diode 52 is reverse-biased, depletion regions around the implanted JBS regions 78 expand to block reverse current through the Schottky diode 52. As a result, the expanded depletion regions function to both protect the Schottky junction 68 and limit reverse-bias leakage current in the Schottky diode 52.

Figure 6:
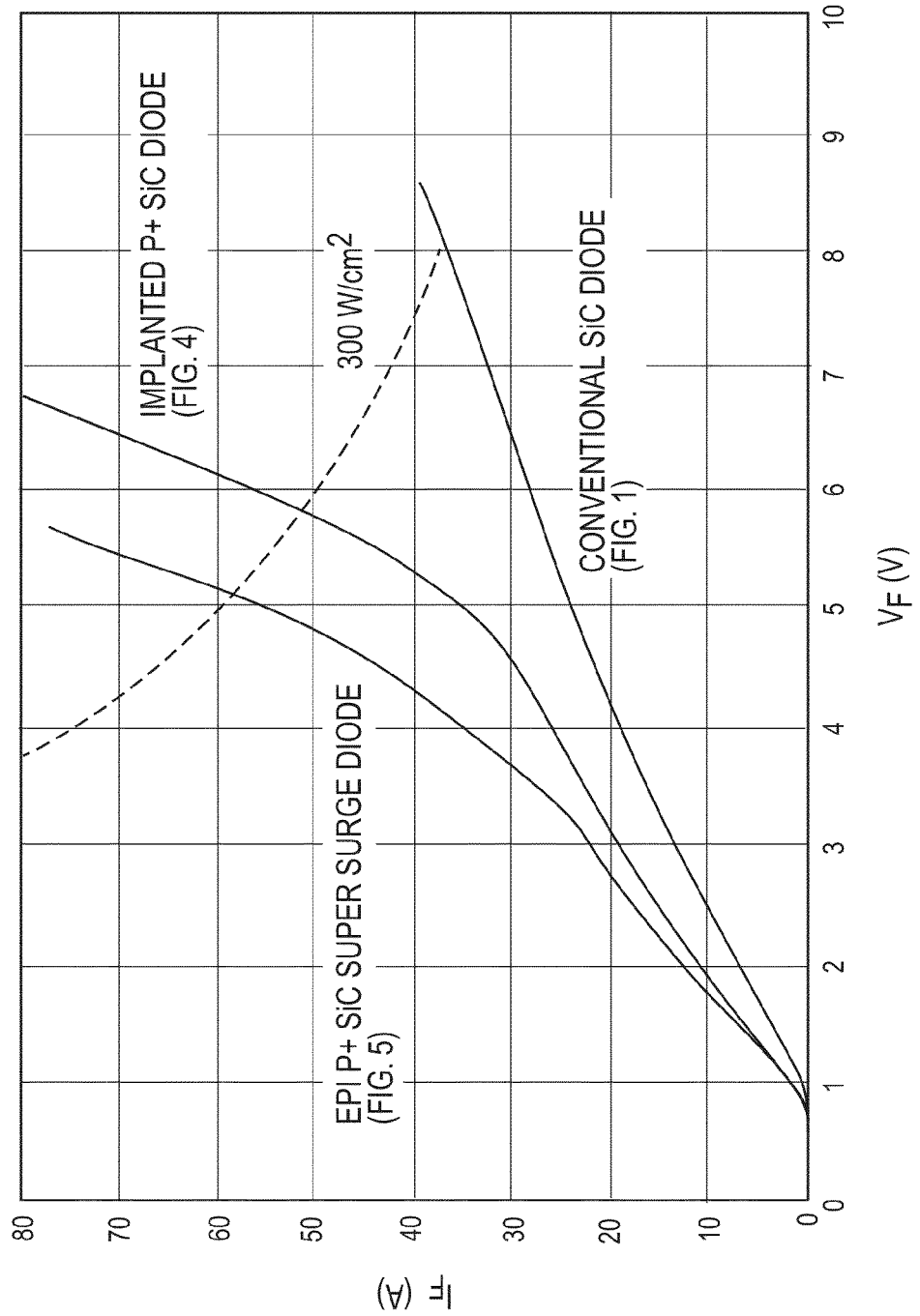
FIG. 6 illustrates forward current versus forward voltage for one exemplary embodiment of the Schottky diode of FIG. 5 as compared to that of the Schottky diodes of FIGS. 1 and 4.

FIG. 6 illustrates a forward current ($I_F$) versus forward voltage ($V_F$) characteristic of one exemplary embodiment of the Schottky diode 52 of FIG. 5 as compared to that of similar implementations of the Schottky diodes 10 and 30 of FIGS. 1 and 4. As illustrated, once the forward voltage ($V_F$) of the Schottky diode 52 reaches a threshold voltage, which in this example is around 3 V, the p-n junction between the P+ epi region 58 and the drift layer 56 turns on such that the P+ epi region 58 begins to inject holes into the drift layer 56 to thereby decrease the differential on-resistance of the Schottky diode 52. At a super surge condition where the forward current ($I_F$) is equal to $10 \cdot I_{F,RATED}$ and $I_{RATED}$ is a rated forward current of the Schottky diode 52, the power density for the Schottky diode 52 is less than a predetermined maximum power density. More specifically, in this example, the rated forward current ($I_{F,RATED}$) is 5 A and the maximum power density is 300 W/cm². At the super surge condition where $I_F=10 \cdot I_{F,RATED}=50$ A, the forward voltage ($V_F$) is approximately 4.75 V such that the power consumed by the Schottky diode 52 is about 237.5 W. Assuming a 1 cm² active area 60, the power density for the Schottky diode 52 at the super surge condition is then about 237.5 W/cm², which is less than the predetermined maximum power density of 300 W/cm². As illustrated, the surge capability of the Schottky diode 52 is substantially better than the surge capabilities of the Schottky diodes 10 and 30 of FIGS. 1 and 4, respectively.

Figure 7:
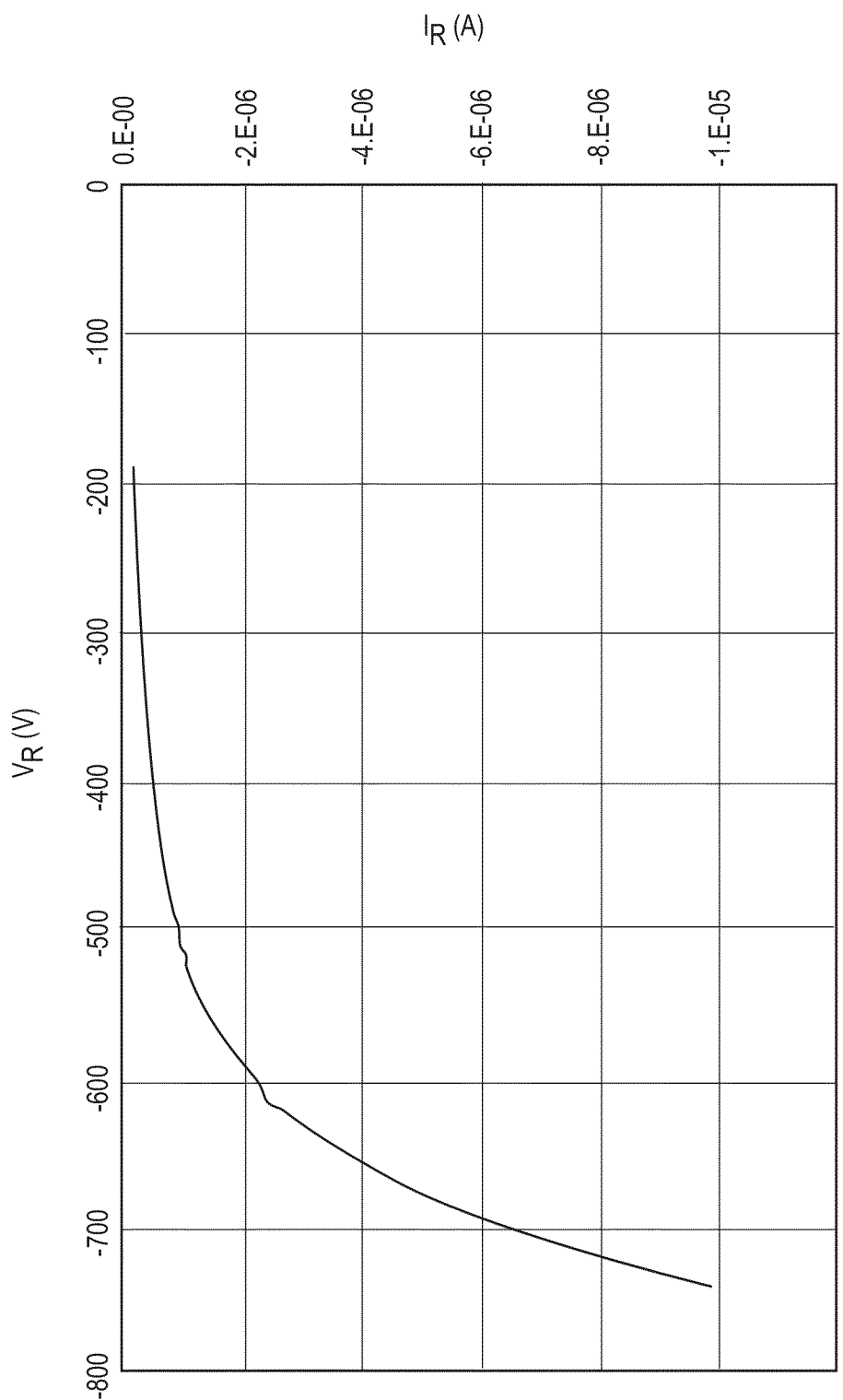
FIG. 7 illustrates reverse-bias leakage current versus reverse-bias voltage for one exemplary embodiment of the Schottky diode of FIG. 5.

FIG. 7 illustrates reverse-bias leakage current versus reverse-bias voltage for one exemplary embodiment of the Schottky diode 52 of FIG. 5. As illustrated, the Schottky diode 52 has low reverse-bias leakage current at the rated reverse-bias voltage, which in this example is 600 V. More specifically, in this example, the reverse-bias leakage current is less than about 2 µA/cm² up to the rated reverse-bias voltage, which again in this example is 600 V.

Figure 8:
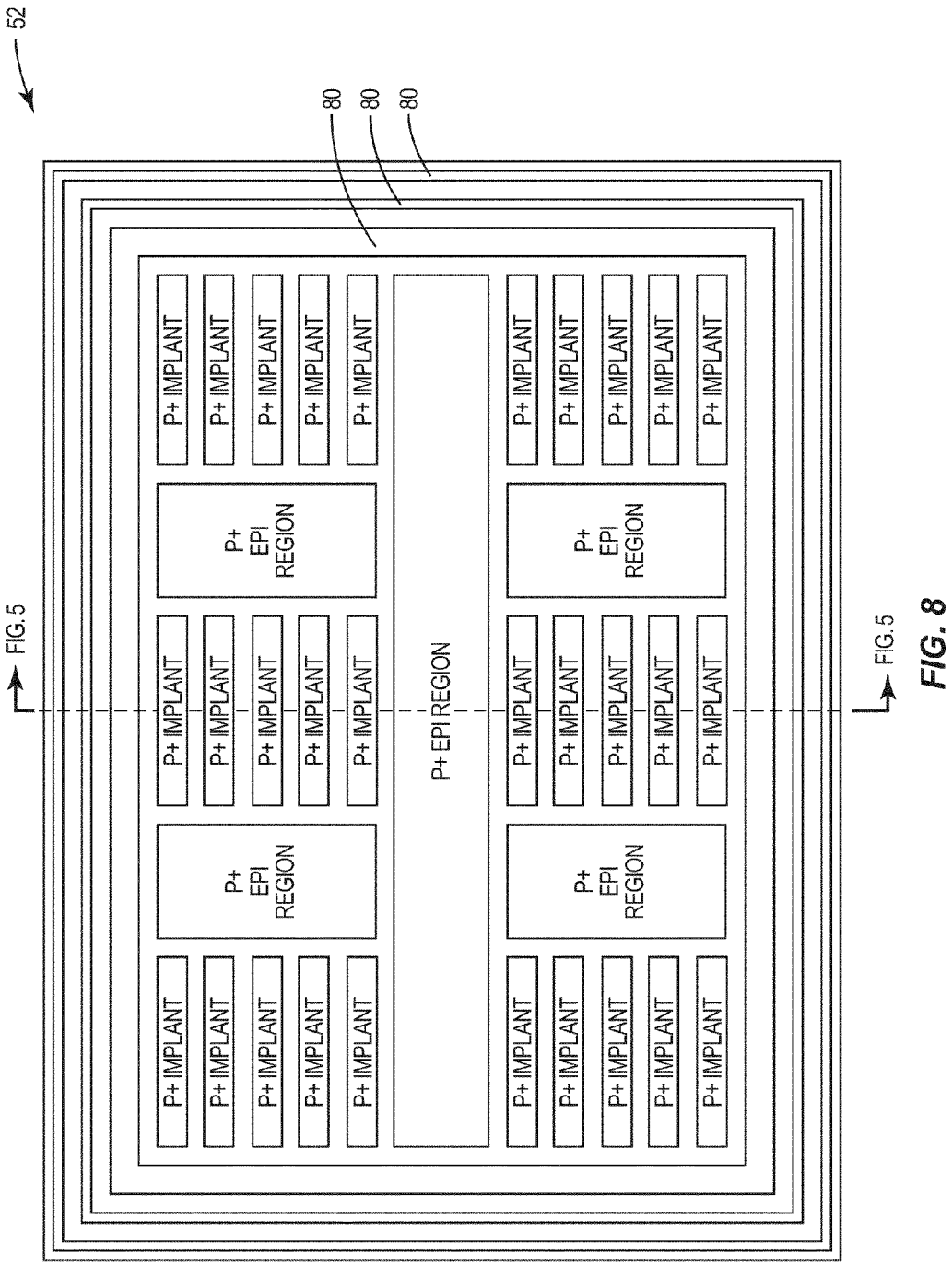
FIG. 8 illustrates a top-down view of an exemplary layout of the Schottky diode of FIG. 5 according to one embodiment of the present disclosure.

FIG. 8 illustrates a top-down view of the Schottky diode 52 of FIG. 5. Notably, FIG. 5 is a cross-sectional view of the Schottky diode 52 along the dashed line shown in FIG. 8. The Schottky diode 52 includes the P+ epi regions 58 and the implanted JBS regions 78 arranged as illustrated in the active area 60 of the Schottky diode 52. The active area 60 is surrounded by the P+ guard rings 80. The ratio of the surface area of the active area 60 of the Schottky diode 52 occupied by the P+ epi regions 58 and the implanted JBS regions 78 to the total surface area of the active area 60 may affect both the reverse leakage current and the forward voltage drop of the Schottky diode 52. For example, if the area occupied by the P+ epi regions 58 and the implanted JBS regions 78 is increased relative to the total area of the active area 60, the reverse leakage current may be reduced and/or the differential on-resistance of the Schottky diode 52 may be further reduced during surge conditions, but the forward voltage drop of the Schottky diode 52 may increase. Thus, the selection of the ratio of the surface area of the active area 60 occupied by the P+ epi regions 58 and the implanted JBS regions 78 may entail a trade-off between reverse leakage current, forward voltage drop, and surge capability. In one embodiment, the P+ epi regions 58 occupy at least 30% of the active area 60. In another embodiment, the P+ epi regions 58 occupy 20% to 50% of the active area 60.

Figure 9:
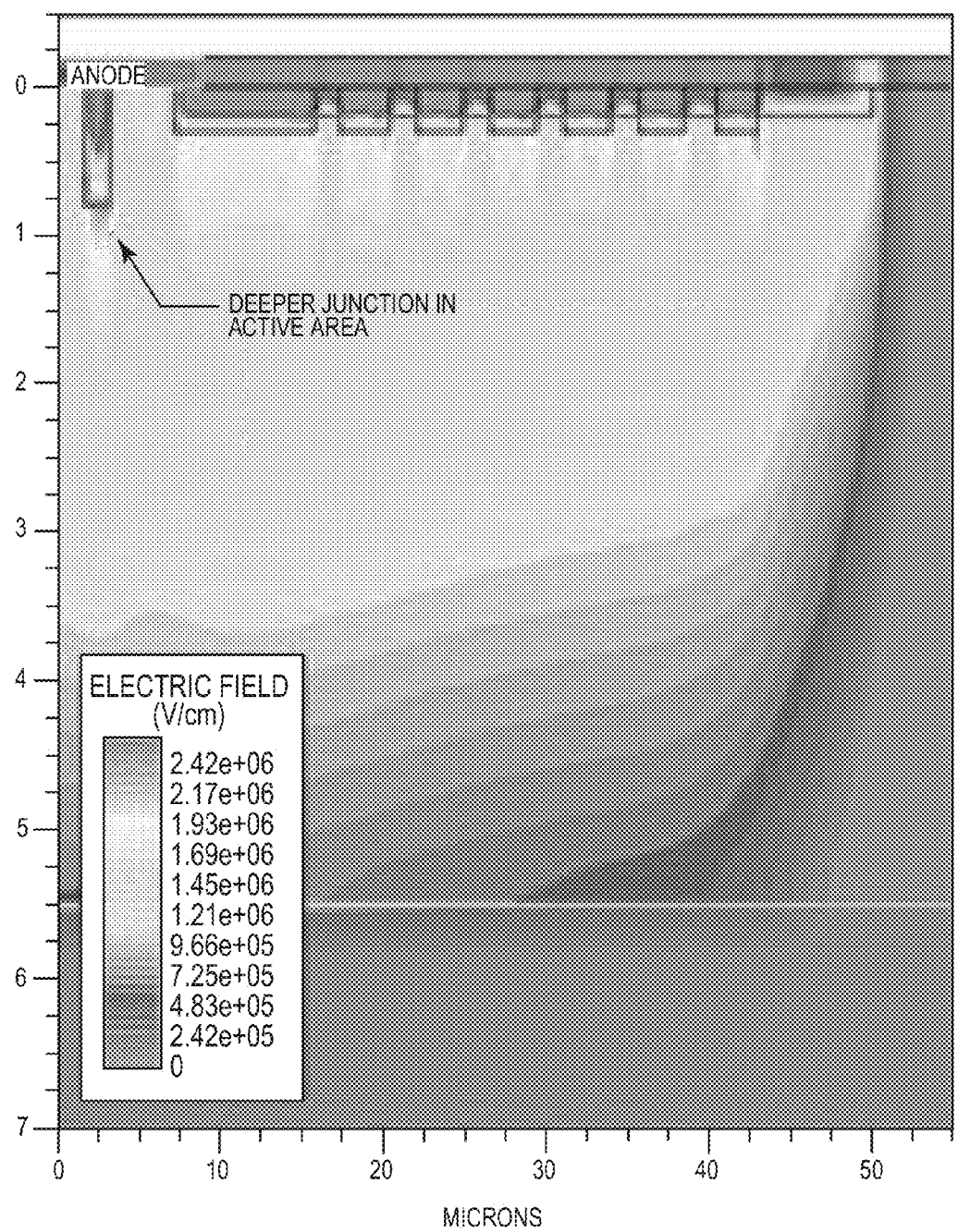
FIG. 9 illustrates an electric field contour for one exemplary embodiment of the Schottky diode of FIG. 5 under a reverse-bias condition.

As discussed above, the implanted JBS regions 78 of the Schottky diode 52 of FIG. 5 provide low reverse-bias leakage current. In addition, in one embodiment, the depth of the implanted JBS regions 78 is greater than the depth of the P+ guard rings 80. As a result, under reverse-bias conditions, the electric field experienced at the bottom of the implanted JBS regions 78 is greater than the electric field experienced at the bottom of the P+ guard rings 80, as illustrated in FIG. 9. As such, an avalanche capability of the Schottky diode 52 is improved in that, at a high reverse-bias breakdown voltage (e.g., 1200 V), break-down of the Schottky diode 52 occurs at the implanted JBS regions 78. The resulting avalanche current is therefore spread across implanted JBS regions 78 in the active area 60 of the Schottky diode 52.

FIGS. 10A through 10H illustrate a process for fabricating the Schottky diode 52 of FIG. 5 according to one embodiment of the present disclosure. Through the description of the process, exemplary materials, doping types, doping levels, structure dimensions, and the selected alternatives are outlined. These aspects are merely illustrative, and the concepts disclosed herein and the claims that follow are not limited to these aspects.

Figure 10A:
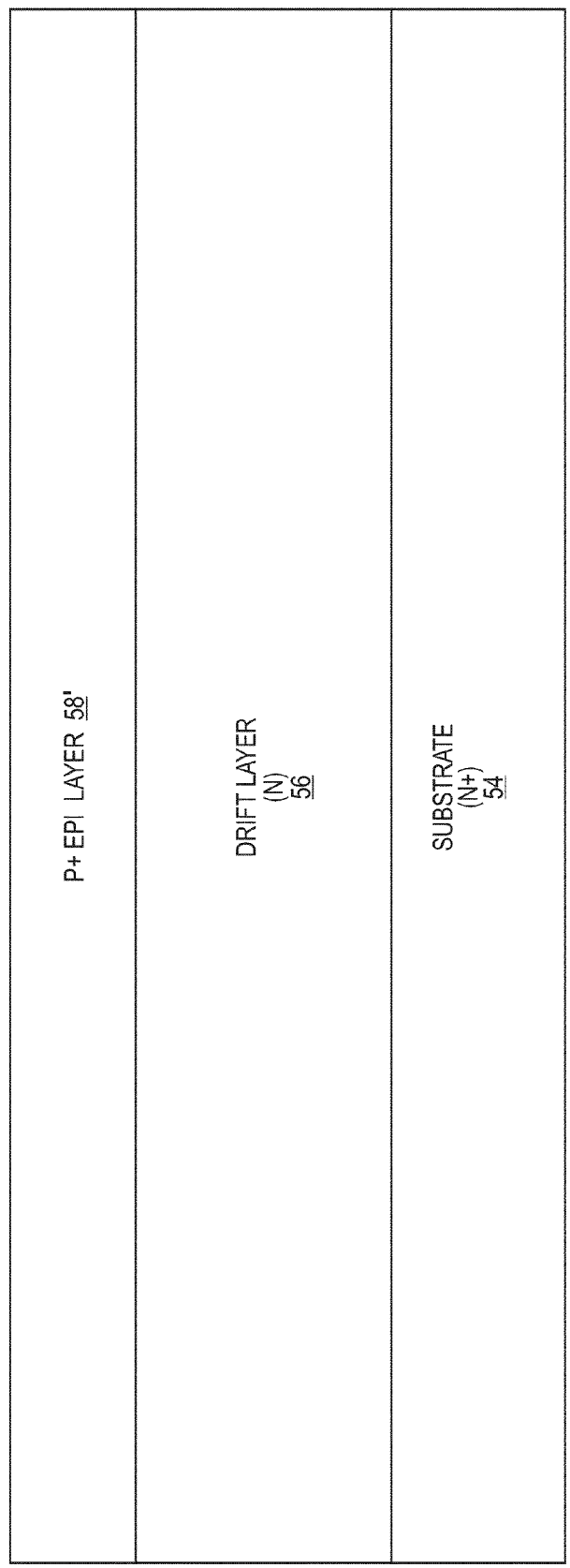
FIGS. 10A through 10H illustrate a process for manufacturing the Schottky diode of FIG. 5 according to one embodiment of the present disclosure.

As illustrated in FIG. 10A, the process starts with the substrate 54, the drift layer 56 on the surface of the substrate 54, and a P+ epitaxial, or epi, layer 58' on the surface of the drift layer 56 opposite the substrate 54. In this embodiment, the substrate 54 is an N-type, single crystal, 4H SiC substrate, which may have various crystalline polytypes, such as 2H, 4H, 6H, 3C, and the like. The substrate 54 may also be formed from other material systems, such as Gallium Nitride (GaN), Gallium Arsenide (GaAs), Silicon (Si), Germanium (Ge), Silicon Germanium (SiGe), and the like. The resistivity of the N-doped, SiC substrate 54 is between about 10 milliohm-cm and 30 milliohm-cm in one embodiment. Initially, the substrate 54 may have a thickness between about 200 microns and 500 microns.

The drift layer 56 is grown on the substrate 54. In this embodiment, the drift layer 56 is also SiC. However, the drift layer 56 may alternatively be formed from other material systems such as, for example, GaN, GaAs, Si, Ge, SiGe, and the like. The drift layer 56 may be grown on the substrate 54 and doped in situ, wherein the drift layer 56 is doped as it is grown with an N-type doping material. Notably, one or more buffer layers (not shown) may be formed on the substrate 54 prior to forming the drift layer 56. The buffer layer(s) may be used as a nucleation layer and may be relatively heavily doped with an N-type doping material. The buffer layer may range from 0.5 to 5 microns in certain embodiments.

The drift layer 56 may be relatively uniformly doped throughout or may employ graded doping throughout all or a portion thereof. For a uniformly doped drift layer 56, the doping concentration may be between about $2 \times 10^{15}$ cm⁻³ and $1 \times 10^{16}$ cm⁻³ in one embodiment. With graded doping, the doping concentration is highest at the bottom of the drift layer 56 near the substrate 54 and lowest at the top of the drift layer 56 near the Schottky contact 66. The doping concentration generally decreases in a stepwise or continuous fashion from a point at or near the bottom to a point at or near the top of the drift layer 56. In one embodiment employing graded doping, the lower portion of the drift layer 56 may be doped at a concentration of about $1 \times 10^{15}$ cm⁻³ and the upper portion of the drift layer 56 may be doped at a concentration of about $5 \times 10^{16}$ cm⁻³. In another embodiment employing graded doping, the lower portion of the drift layer 56 may be doped at a concentration of about $5 \times 10^{15}$ cm⁻³ and the upper portion of the drift layer 56 may be doped at a concentration of about $1 \times 10^{16}$ cm⁻³.

The drift layer 56 may be between four and ten microns thick in select embodiments depending on the desired reverse breakdown voltage. In one embodiment, the drift layer 56 is about one micron thick per 100 V of desired reverse breakdown voltage. For example, a Schottky diode 52 with a reverse breakdown voltage of 600 V may have a drift layer 56 with a thickness of about six microns.

Once the drift layer 56 is formed, a P+ epitaxial, or epi, layer 58' is grown on the surface of the drift layer 56 opposite the substrate 54. In this embodiment, like the substrate 54 and the drift layer 56, the P+ epi layer 58' is SiC. However, the P+ epi layer 58' may alternatively be formed in other material systems such as, for example, GaN, GaAs, Si, Ge, SiGe, and the like. The P+ epi layer 58' may be grown on the drift layer 56 and doped in situ, wherein the P+ epi layer 58' is doped as it is grown with a P-type doping material. In one embodiment, the P+ epi layer 58' has a doping concentration greater than $1 \times 10^{18}$ cm$^{-3}$ and a thickness greater than or equal to 0.3 microns. In another embodiment, the P+ epi layer 58' has a doping concentration in a range of and including $5 \times 10^{18}$ cm$^{-3}$ to $1 \times 10^{20}$ cm$^{-3}$ and a thickness in a range of and including 0.5 to 1 micron. In yet another embodiment, the P+ epi layer 58' has a doping concentration in a range of and including $1 \times 10^{19}$ cm$^{-3}$ to $1 \times 10^{20}$ cm$^{-3}$ and a thickness in a range of and including 0.3 to 0.5 micron.

Figure 10B:
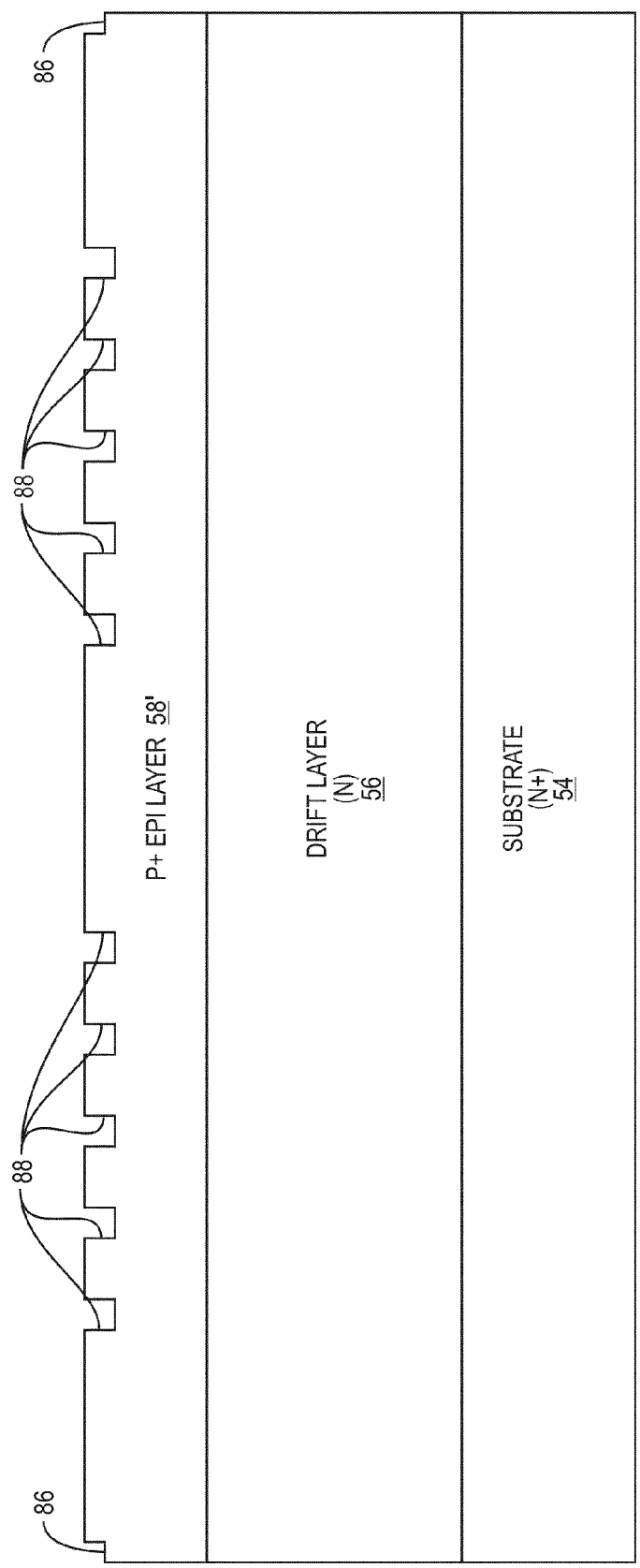

Once the P+ epi layer 58' is formed, the top surface is etched to create one or more alignment marks 86 as illustrated in FIG. 10B. As will be understood by one of ordinary skill in the art, the alignment marks 86 are used to align masks during the various stages of the manufacturing process. In this embodiment, at the same time that the top surface is etched to create the one or more alignment marks 86, the top surface is also etched to create recesses 88 at locations in the top surface of the P+ epi layer 58' that correspond to the desired locations of the JBS element recesses 76 in the top surface of the drift layer 56, as also illustrated in FIG. 10B. By using a single etch to create both the alignment marks 86 and the recesses 88, the JBS element recesses 76 are formed without any additional processing steps (i.e., without any additional cost).

The depth and width of the recesses 88 will vary depending on the particular implementation. In general, the depth of the recesses 88 is such that, after etching the P+ epi layer 58' to create the P+ epi region 58 (as discussed below), the resulting JBS element recesses 76 created in the top surface of the drift layer 56 have the desired depth. In one embodiment, the depth of the recesses 88 is greater than or equal to 0.1 micron. In another embodiment, the depth of the recesses 88 is greater than or equal to 0.3 microns. In yet another embodiment, the depth of the recesses 88 is in a range of and including 0.1 to 0.8 microns. In yet another embodiment, the depth of the recesses 88 is in a range of and including 0.3 to 0.8 microns.

Figure 10C:
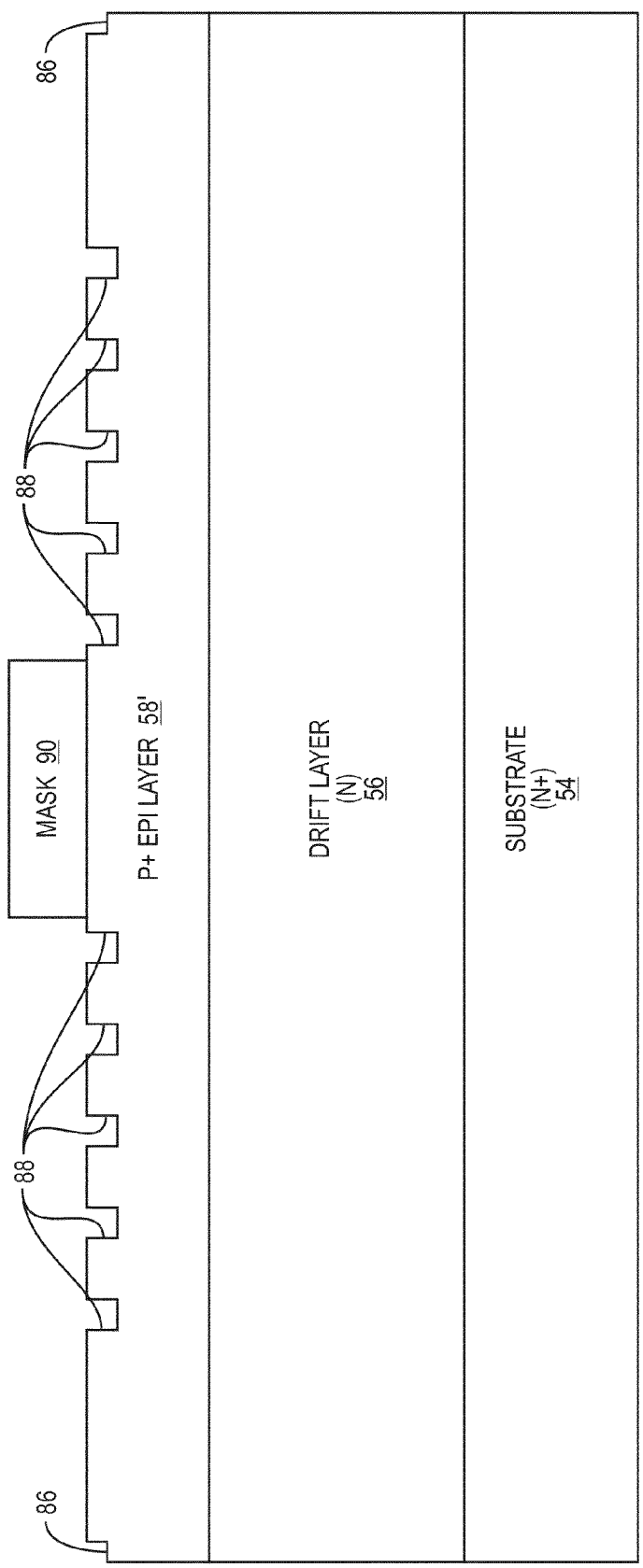
Figure 10D:
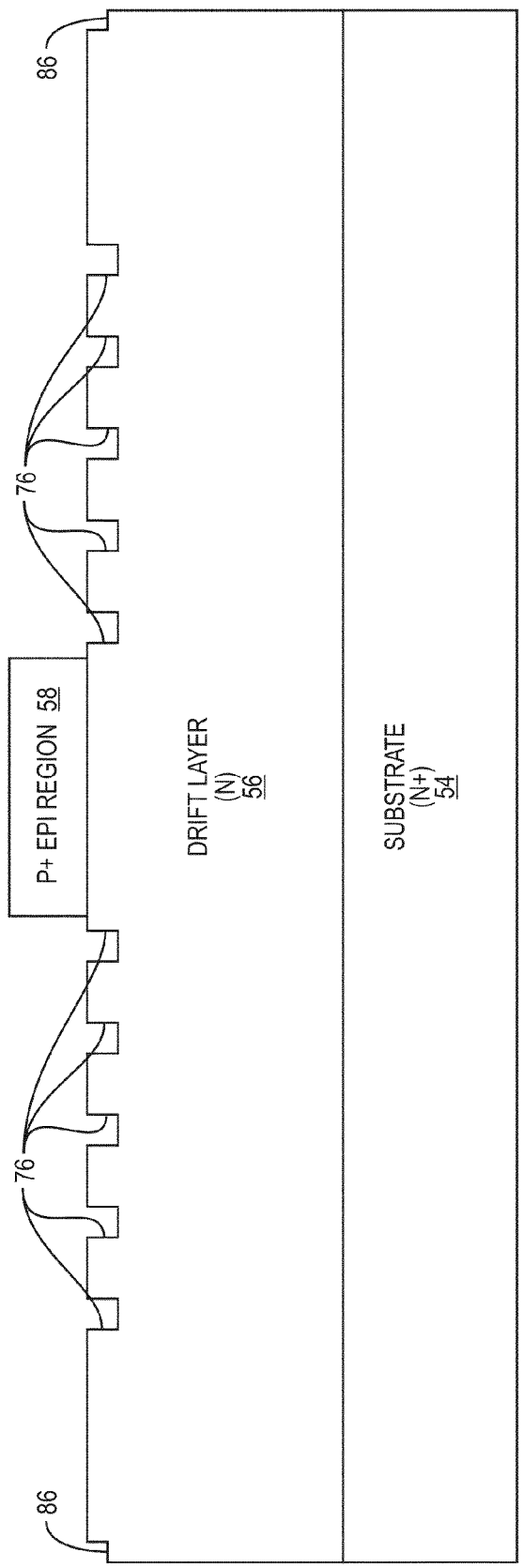

Next, as illustrated in FIGS. 10C and 10D, a mask 90 is provided on a portion of the top surface of the P+ epi layer 58' that is to be the P+ epi region 58, and then the P+ epi layer 58' is etched to form the P+ epi region 58. Due to the recesses 88, etching of the P+ epi layer 58' results in the creation of the JBS element recesses 76 in the top surface of the drift layer 56, as also illustrated in FIG. 10D. Again, in one embodiment, the depth of the JBS element recesses 76 is greater than or equal to 0.1 micron. In another embodiment, the depth of the JBS element recesses 76 is greater than or equal to 0.3 microns. In yet another embodiment, the depth of the JBS element recesses 76 is in a range of and including 0.1 to 0.8 microns. In yet another embodiment, the depth of the JBS element recesses 76 is in a range of and including 0.3 to 0.8 microns.

Figure 10E:
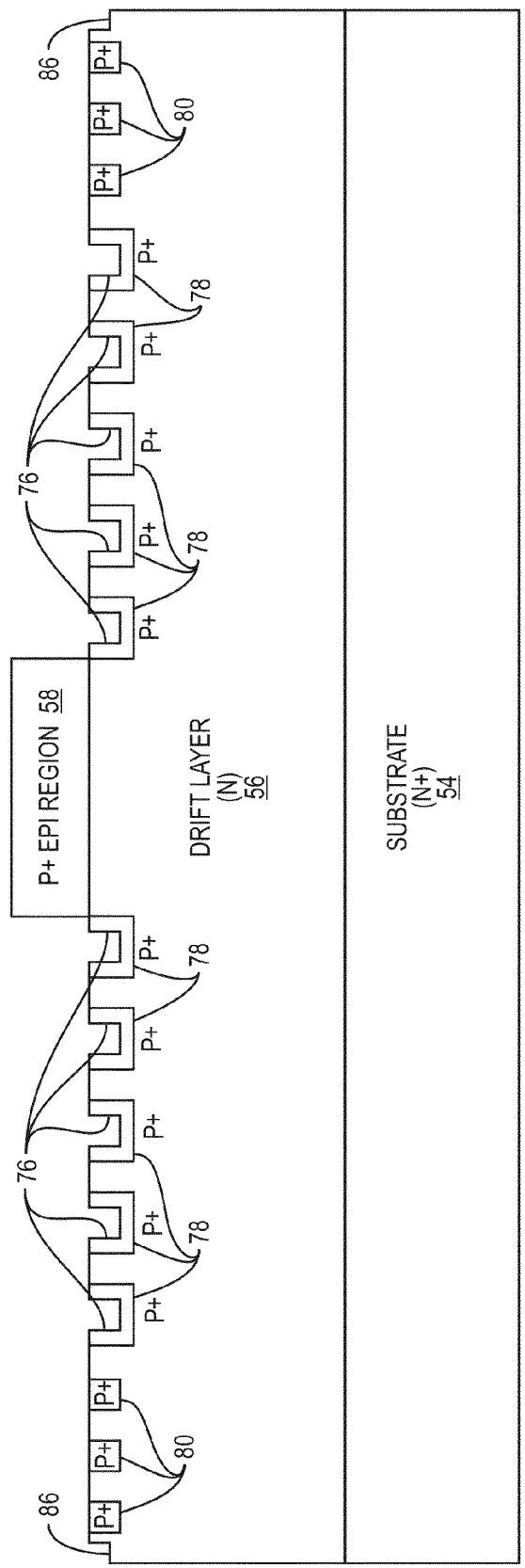

After etching the P+ epi layer 58' to create the P+ epi region 58 and the JBS element recesses 76, a P-type dopant is implanted into the JBS element recesses 76 to create the implanted JBS regions 78, as illustrated in FIG. 10E. The doping concentration of the implanted JBS regions 78 is preferably greater than or equal to $1 \times 10^{18}$ cm$^{-3}$. In one embodiment, the implanted JBS regions 78 extend below the bottom of the JBS element recesses 76 by an additional depth of 0.2 to 0.3 microns. In one embodiment, a total depth of the JBS element recesses 76 and the implanted JBS regions 78 is in a range of and including 0.5 to 1 microns. However, the total depth of the JBS element recesses 76 and the implanted JBS regions 78 may vary depending on the particular implementation. In addition, while implanting the implanted JBS regions 78 into the JBS element recesses 76, P-type dopants may also be implanted into the top surface of the drift layer 56 to create the P+ guard rings 80, as also illustrated in FIG. 10E.

Figure 10F:
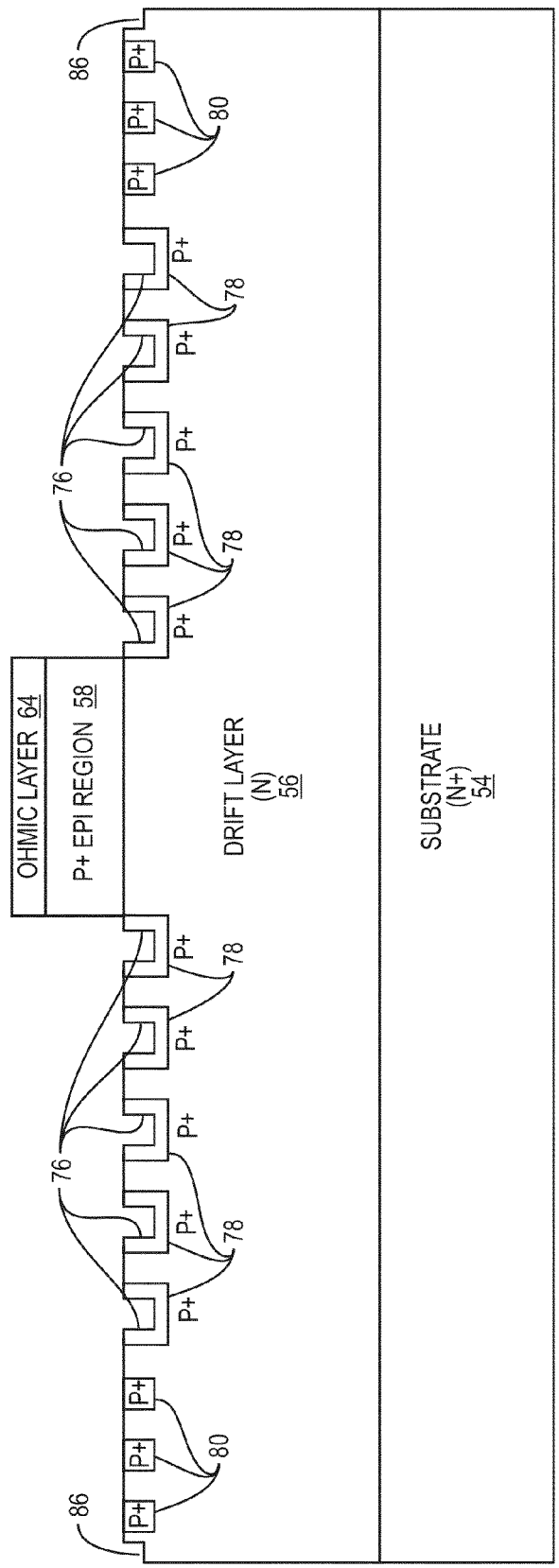
Figure 10G:
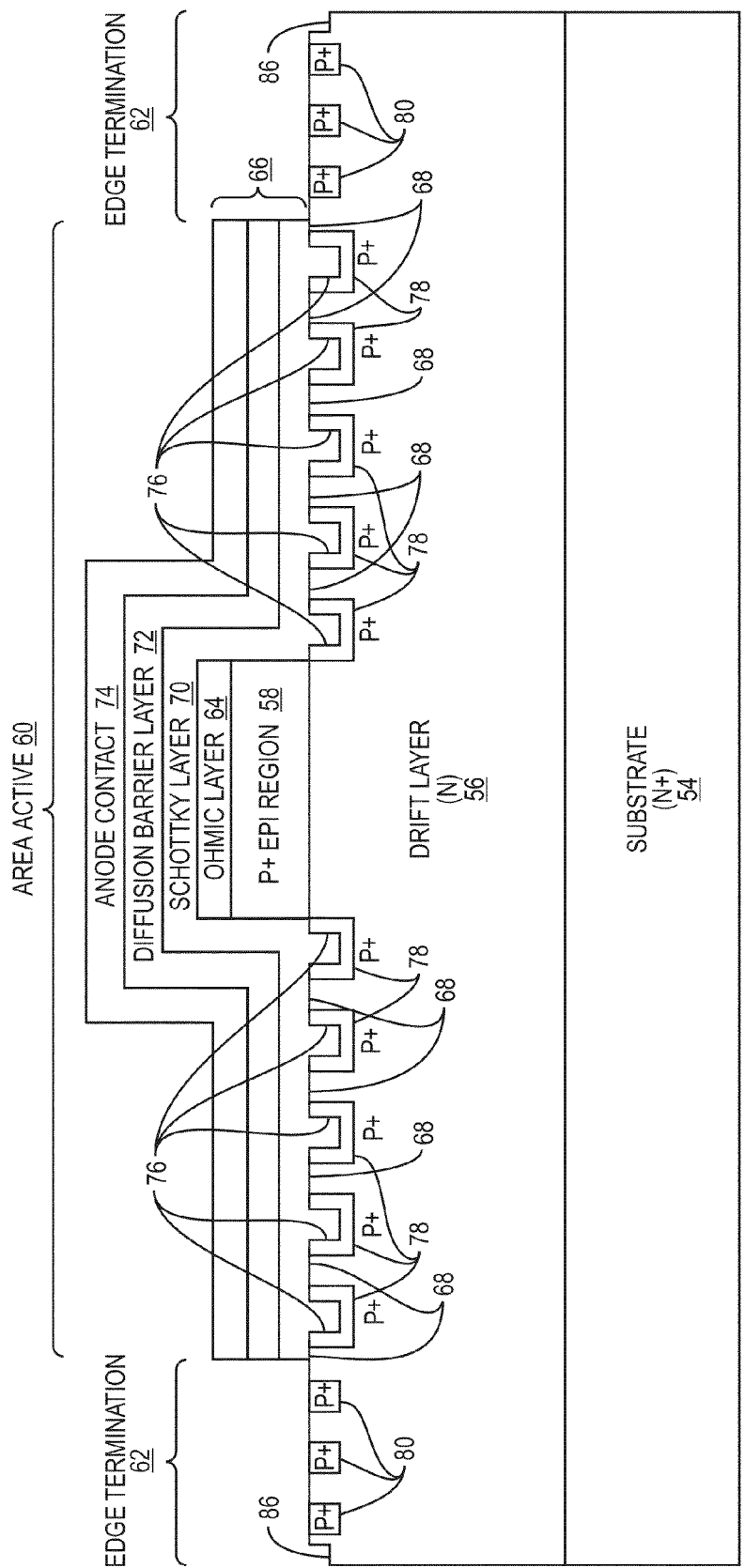

Next, as illustrated, in FIG. 10F, the ohmic layer 64 is formed on the surface of the P+ epi region 58. The ohmic layer 64 may be formed of an ohmic metal such as, for example, Nickel (Ni), Nickel Silicide (NiSi), or Nickel Aluminide (NiAl). Once the ohmic layer 64 is formed, the Schottky contact 66 is formed over a portion of the top surface of the drift layer 56 over the implanted JBS regions 78 as well as over the surface of the ohmic layer 64 opposite the P+ epi region 58, as illustrated in FIG. 10G. The Schottky contact 66 includes the Schottky layer 70, optionally the diffusion barrier layer 72, and the anode contact 74. The thickness of the Schottky layer 70 will vary based on desired device characteristics and the metal used to form the Schottky layer 70, but will generally be between about 100 and 4500 Angstroms. For a 600 V device (i.e., a Schottky diode 52 having low reverse-bias leakage current up to a reverse-bias of 600 V), the Schottky layer 70 may be formed of Tantalum (Ta) and be between about 200 and 1200 Angstroms, may be formed of Titanium (Ti) and be between about 500 and 2500 Angstroms, or may be formed of Aluminum (Al) and be between about 3500 and 4500 Angstroms. Ta is associated with a very low barrier height, especially when used in combination with SiC to form a Schottky junction. Ta is also very stable against SiC.

Depending on the metal used for the Schottky layer 70 and the anode contact 74, one or more diffusion barrier layers 72 may be formed between the Schottky layer 70 and the anode contact 74. The diffusion barrier layer 72 may be formed of Titanium Tungsten alloy (TiW), Titanium Nickel alloy (TiN), Ta, and any other suitable material, and may be between about 75 and 400 Angstroms thick in select embodiments. The diffusion barrier layer 72 helps prevent diffusion between the metals used to form the Schottky layer 70 and the anode contact 74. Notably, the diffusion barrier layer 72 is not used in certain embodiments where the Schottky layer 70 is Ta and the anode contact 74 is formed from Al. The diffusion barrier layer 72 is generally beneficial in embodiments where the Schottky layer 70 is Ti and the anode contact 74 is formed from Al.

The anode contact 74 is formed over the Schottky layer 70, or if present, the diffusion barrier layer 72. The anode contact 74 is generally relatively thick, formed from a metal, and acts as a bond pad for the anode of the Schottky diode 52. The anode contact 74 may be formed from Al, Gold (Au), Silver (Ag), or the like.

While not illustrated, an encapsulant layer is generally then formed over at least the exposed surfaces of the anode contact 74 and any exposed surface of the drift layer 56. The encapsulant layer may be a nitride, such as Silicon Nitride (SiN), and acts as a conformal coating to protect the underlying layers from adverse environmental conditions. For further protection against scratches or like mechanical damage, a polyimide layer may be provided over the encapsulant layer.

Figure 10H:
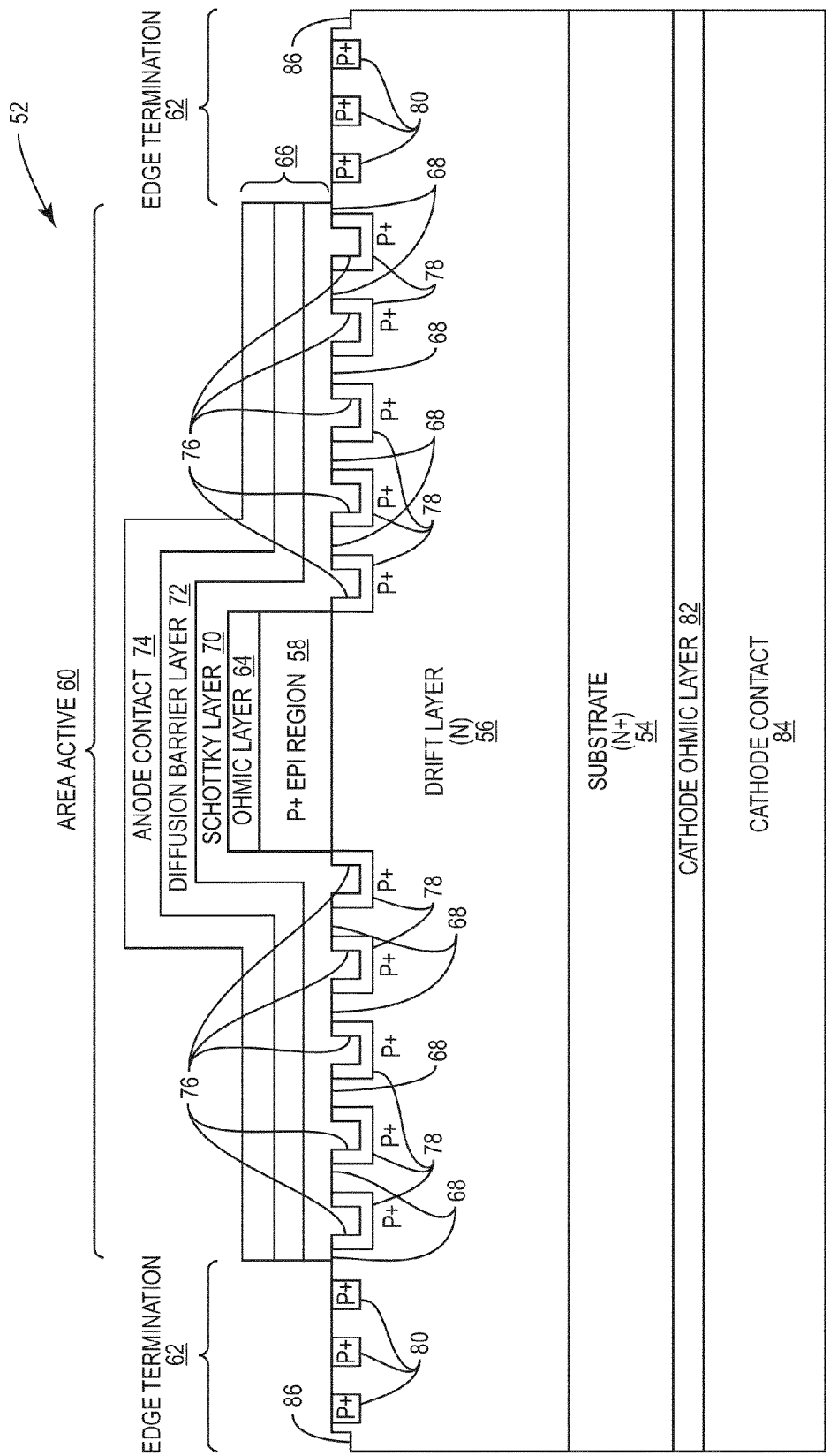

At this point, processing switches from the front side (top) of the Schottky diode 52 to the back side (bottom) of the Schottky diode 52. As illustrated in FIG. 10H, the substrate 54 is substantially thinned by removing a bottom portion of the substrate 54 though a grinding, etching, or like process. For a 600 V Schottky diode 52, the substrate 54 may be thinned to a thickness between about 50 and 200 microns in a first embodiment, and between about 75 and 125 microns in a second embodiment. Thinning the substrate 54 or otherwise employing a thin substrate 54 reduces the overall electrical and thermal resistance between the anode and cathode of the Schottky diode 52 and allows the device to handle higher current densities without overheating.

Finally, as also illustrated in FIG. 10H, the cathode ohmic layer 82 is formed on the bottom of the substrate 54 with an ohmic metal, such as Ni, NiSi, and NiAl. In embodiments where a polyimide layer is employed, the cathode ohmic layer 82 may be laser annealed instead of baking the entire device at a high temperature to anneal the ohmic metal. Laser annealing allows the ohmic metal to be heated sufficiently for annealing, yet does not heat the rest of the device to temperatures that would otherwise damage or destroy the polyimide layer. Once the cathode ohmic layer 82 is formed and annealed, the cathode contact 84 is formed over the cathode ohmic layer 82 to provide a solder or like interface for the Schottky diode 52, as also illustrated in FIG. 10H.

Figure 11:
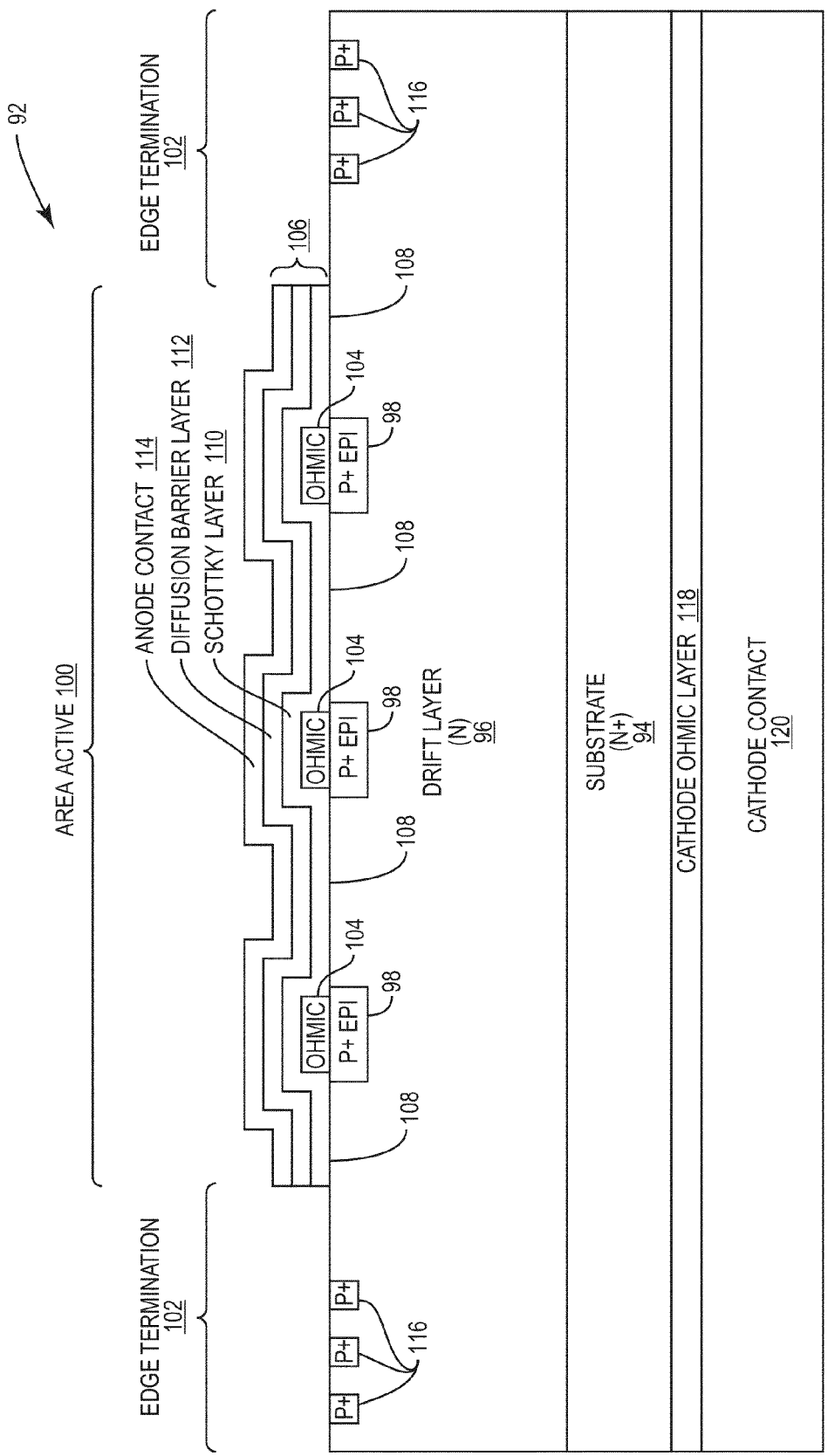
FIG. 11 illustrate a Schottky diode having both super surge capability and low reverse-bias leakage current according to another embodiment of the present disclosure.

FIG. 11 illustrates a Schottky diode 92 having both super surge capability and low reverse-bias leakage current according to another embodiment of the present disclosure. This embodiment is similar to the Schottky diode 52 of FIG. 5 but where epitaxial JBS regions beneath the Schottky layer function to both inject minority carriers under surge conditions and to minimize reverse-bias leakage current. As illustrated, the Schottky diode 92 includes a substrate 94 and a drift layer 96 on a surface of the substrate 94. In this embodiment, the substrate 94 and the drift layer 96 are both N-type, where the substrate 94 is highly doped and the drift layer 96 is relatively lightly doped. Further, for illustrative purposes, assume that the substrate 94 and the drift layer 96 are each formed of SiC. However, other semiconductor materials may be used.

In order to provide both super surge capability and low reverse-bias leakage current, the Schottky diode 92 includes a number of epitaxial JBS regions 98 at a surface of the drift layer 96 opposite the substrate 94 in an active area 100 of the Schottky diode 92. The active area 100 is at least partially, but preferably completely, surrounded by an edge termination 102. In this embodiment, since the drift layer 96 is N-type, the epitaxial JBS regions 98 are P-type. The epitaxial JBS regions 98 are highly doped. As discussed below in detail, when the Schottky diode 92 is under surge conditions, the epitaxial JBS regions 98 inject holes into the drift layer 96 to thereby provide conductivity modulation. Since the epitaxial JBS regions 98 are epitaxially grown, the epitaxial JBS regions 98 do not suffer from the implant damage discussed above with respect to the implanted JBS regions 50 of the Schottky diode 30 of FIG. 4. As a result, the conductivity modulation provided by the epitaxial JBS regions 98 is significantly better than that provided by the implanted JBS regions 50 of the Schottky diode 30, which in turn enables super surge capability. Ohmic layers 104 are provided on the surfaces of the epitaxial JBS regions 98 to provide a low-resistance contact to the epitaxial JBS regions 98.

The Schottky diode 92 also includes a Schottky contact 106 on the surface of the drift layer 96 opposite the substrate 94 and extending over the surfaced of the ohmic layers 104 opposite the epitaxial JBS regions 98 in the active area 100 of the Schottky diode 92. The Schottky contact 106 forms a Schottky junction 108 between the drift layer 96 and the Schottky contact 106. The area of the drift layer 96 below the Schottky contact 106 is referred to herein as the active area 100 of the drift layer 96 and thus the active area 100 of the Schottky diode 92. The Schottky contact 106 includes a Schottky layer 110 on the surface of the drift layer 96 that forms the Schottky junction 108 between the drift layer 96 and the Schottky contact 106, a diffusion barrier layer 112 on a surface of the Schottky layer 110 opposite the drift layer 96, and an anode contact 114 on a surface of the diffusion barrier layer 112 opposite the Schottky layer 110. The diffusion barrier layer 112 is optional and may be included to prevent materials from one of the Schottky layer 110 and the anode contact 114 from diffusing into the other.

Beneath the Schottky contact 106, the epitaxial JBS regions 98 form an array of JBS regions. The epitaxial JBS regions 98 operate to protect the Schottky junction 108 from high localized electric fields under reverse-bias conditions, which in turn reduces a reverse-bias leakage current of the Schottky diode 92. Notably, while in this embodiment there are three epitaxial JBS regions 98, the Schottky diode 92 is not limited thereto. Depending on the particular layout and the particular implementation, there may be any number of two or more epitaxial JBS regions 98.

The edge termination 102 includes, in this embodiment, a number of P+ guard rings 116 that at least partially, but preferably completely, surround the active area 100. Lastly, the Schottky diode 92 includes a cathode ohmic layer 118 on a second surface of the substrate 94 opposite the drift layer 96 and a cathode contact 120 on a surface of the cathode ohmic layer 118 opposite the substrate 94. The cathode ohmic layer 118 is optional and may be provided between the substrate 94 and the cathode contact 120 to facilitate a low impedance coupling therebetween.

During operation, as the Schottky diode 92 is forward-biased, the Schottky junction 108 turns on before the p-n junctions between the epitaxial JBS regions 98 and the drift layer 96. At low forward voltages, current transport in the Schottky diode 92 is dominated by majority carriers (electrons) injected across the Schottky junction 108. As such, the Schottky diode 92 acts like a traditional Schottky diode. In this configuration, there is little or no minority carrier injection, and thus no minority charge. As a result, the Schottky diode 92 is capable of fast switching speeds at normal operating voltages.

When under a surge condition at which the forward voltage of the Schottky diode 92 reaches a predetermined threshold voltage, the p-n junctions between the epitaxial JBS regions 98 and the drift layer 96 turn on. As a result, minority carriers (holes) are injected from the epitaxial JBS regions 98 into the drift layer 96, which in turn decrease the differential on-resistance of the Schottky diode 92. Since the epitaxial JBS regions 98 are epitaxially grown, the epitaxial JBS regions 98 do not suffer from implant damage and, therefore, a lifetime of the holes injected from the epitaxial JBS regions 98 and thus the conductivity modulation is significantly improved. The conductivity modulation provided by the holes injected by the epitaxial JBS regions 98 causes a resistance of the drift layer 96, and thus a differential on-resistance of the Schottky diode 92, to decrease, which in turn significantly reduces power consumed by the Schottky diode 92 during surge conditions. Specifically, in the preferred embodiment, by reducing the differential on-resistance of the Schottky diode 92 during surge conditions, the Schottky diode 92 has super surge capability. In one embodiment, the Schottky diode 92 is capable of conducting at least 10 times a rated current of the Schottky diode 52 of FIG. 5 while consuming less than 300 W/cm$^2$.

In addition, as discussed above, the Schottky diode 92 has low reverse-bias leakage current due to the epitaxial JBS regions 98. More specifically, when the Schottky diode 92 is reverse-biased, depletion regions around the epitaxial JBS regions 98 expand to block reverse current through the Schottky diode 92. As a result, the expanded depletion regions function to both protect the Schottky junction 108 and limit reverse-bias leakage current in the Schottky diode 92.

FIGS. 12A through 12G illustrate a process for fabricating the Schottky diode 92 of FIG. 11 according to one embodiment of the present disclosure. Through the description of the process, exemplary materials, doping types, doping levels, structure dimensions, and the selected alternatives are outlined. These aspects are merely illustrative, and the concepts disclosed herein and the claims that follow are not limited to these aspects.

Figure 12A:
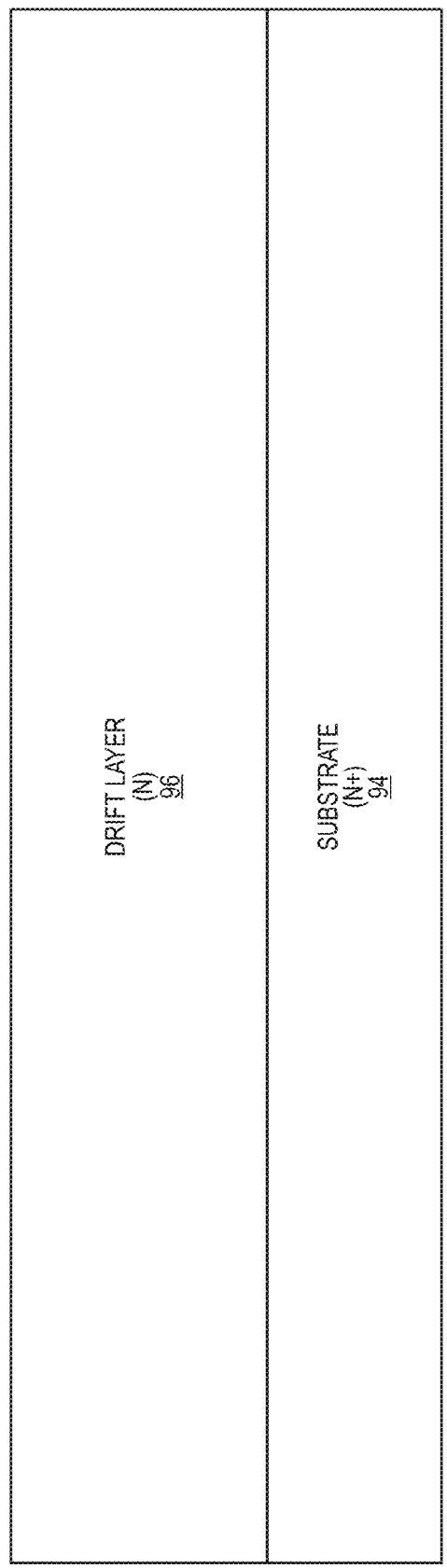
FIGS. 12A through 12G illustrate a process for manufacturing the Schottky diode of FIG. 11 according to one embodiment of the present disclosure.

As illustrated in FIG. 12A, the process starts with the substrate 94 and the drift layer 96 on the surface of the substrate 94. In this embodiment, the substrate 94 is an N-type, single crystal, 4H SiC substrate, which may have various crystalline polytypes, such as 2H, 4H, 6H, 3C, and the like. The substrate 94 may also be formed from other material systems, such as GaN, GaAs, Si, Ge, SiGe, and the like. The resistivity of the N-doped, SiC substrate 94 is between about 10 milliohm-cm and 30 milliohm-cm in one embodiment. Initially, the substrate 94 may have a thickness between about 200 microns and 500 microns.

The drift layer 96 is grown on the substrate 94. In this embodiment, the drift layer 96 is also SiC. However, the drift layer 96 may alternatively be formed from other material systems such as, for example, GaN, GaAs, Si, Ge, SiGe, and the like. The drift layer 96 may be grown on the substrate 94 and doped in situ, wherein the drift layer 96 is doped as it is grown with an N-type doping material. Notably, one or more buffer layers (not shown) may be formed on the substrate 94 prior to forming the drift layer 96. The buffer layer(s) may be used as a nucleation layer and be relatively heavily doped with an N-type doping material. The buffer layer may range from 0.5 to 5 microns in certain embodiments.

The drift layer 96 may be relatively uniformly doped throughout or may employ graded doping throughout all or a portion thereof. For a uniformly doped drift layer 96, the doping concentration may be between about $2 \times 10^{15}$ cm$^{-3}$ and $1 \times 10^{16}$ cm$^{-3}$ in one embodiment. With graded doping, the doping concentration is highest at the bottom of the drift layer 96 near the substrate 94 and lowest at the top of the drift layer 96 near the Schottky contact 106. The doping concentration generally decreases in a stepwise or continuous fashion from a point at or near the bottom to a point at or near the top of the drift layer 96. In one embodiment employing graded doping, the lower portion of the drift layer 96 may be doped at a concentration of about $1 \times 10^{15}$ cm$^{-3}$ and the upper portion of the drift layer 96 may be doped at a concentration of about $5 \times 10^{16}$ cm$^{-3}$. In another embodiment employing graded doping, the lower portion of the drift layer 96 may be doped at a concentration of about $5 \times 10^{15}$ cm$^{-3}$ and the upper portion of the drift layer 96 may be doped at a concentration of about $1 \times 10^{16}$ cm$^{-3}$.

The drift layer 96 may be between four and ten microns thick in select embodiments depending on the desired reverse breakdown voltage. In one embodiment, the drift layer 96 is about one micron thick per 100 V of desired reverse breakdown voltage. For example, a Schottky diode 92 with a reverse breakdown voltage of 600 V may have a drift layer 96 with a thickness of about six microns.

Figure 12B:
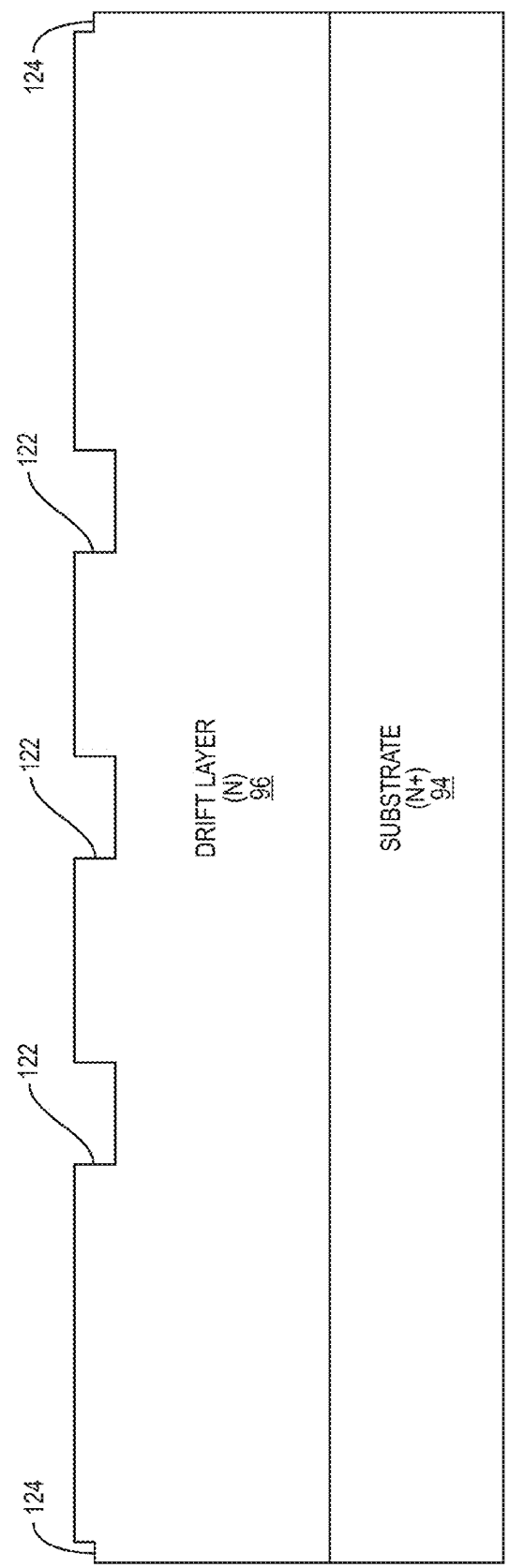

Once the drift layer 96 is formed, the top surface of the drift layer 96 is etched to form recesses 122 for the epitaxial JBS regions 98 (FIG. 9), as illustrated in FIG. 12B. The dimensions of the recesses 122 correspond to the desired dimensions of the epitaxial JBS regions 98. In this embodiment, the etching of the top surface of the drift layer 96 to form the recesses 122 is performed in the same etching step used to create alignment marks 124. As will be understood by one of ordinary skill in the art, the alignment marks 124 are used to align masks during the various stages of the manufacturing process. By using a single etch to create both the alignment marks 124 and the recesses 122, the recesses 122 for the epitaxial JBS regions 98 can be formed without any additional processing steps (i.e., without any additional cost).

Figure 12C:
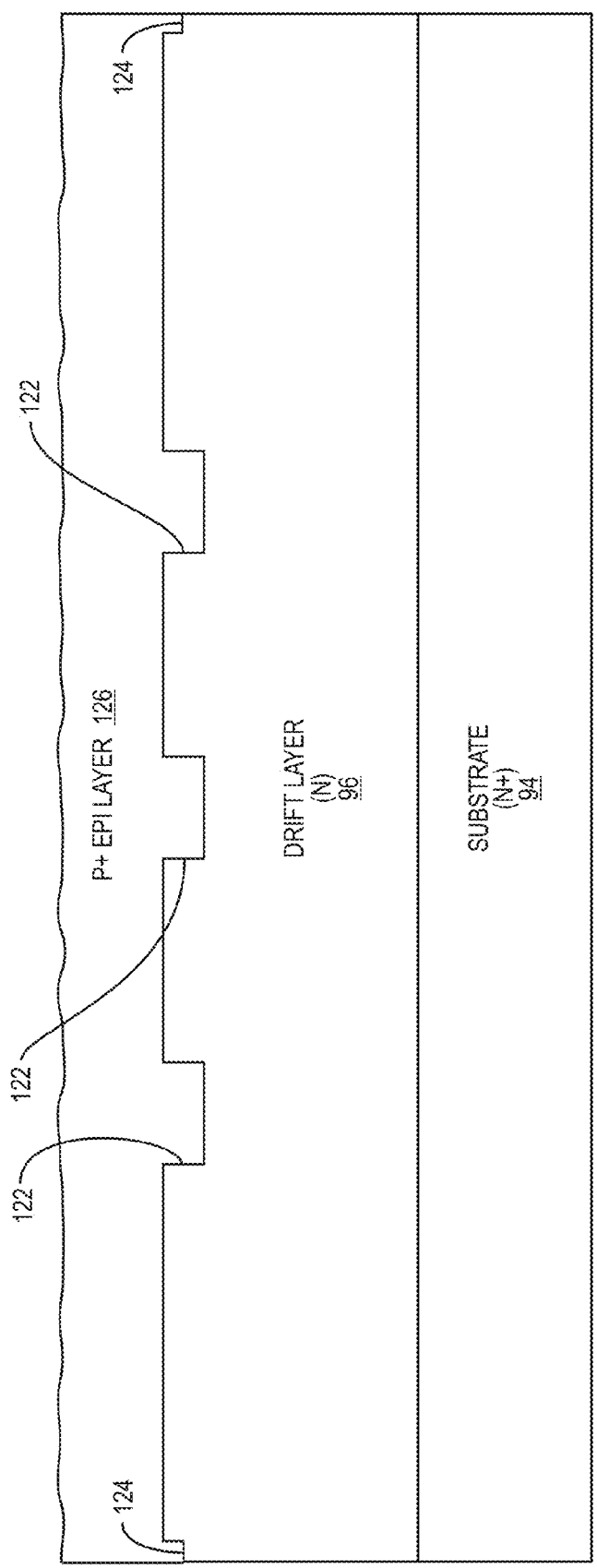

Next, a P+ epi layer 126 is grown on the surface of the drift layer 96 via an epitaxial regrowth process, as illustrated in FIG. 12C. In this embodiment, like the substrate 94 and the drift layer 96, the P+ epi layer 126 is SiC. However, the P+ epi layer 126 may alternatively be formed in other material systems such as, for example, GaN, GaAs, Si, Ge, SiGe, and the like. The P+ epi layer 126 may be grown on the drift layer 96 and doped in situ, wherein the P+ epi layer 126 is doped as it is grown with a P-type doping material. In one embodiment, the P+ epi layer 126 has a doping concentration greater than $1 \times 10^{18}$ cm$^{-3}$. In another embodiment, the P+ epi layer 126 has a doping concentration in a range of and including $5 \times 10^{18}$ cm$^{-3}$ to $1 \times 10^{20}$ cm$^{-3}$. In yet another embodiment, the P+ epi layer 126 has a doping concentration in a range of and including $1 \times 10^{19}$ cm$^{-3}$ to $1 \times 10^{20}$ cm$^{-3}$. In one embodiment, the thickness of the P+ epi layer 126 is greater than or equal to the depth of the recesses 122.

Figure 12D:
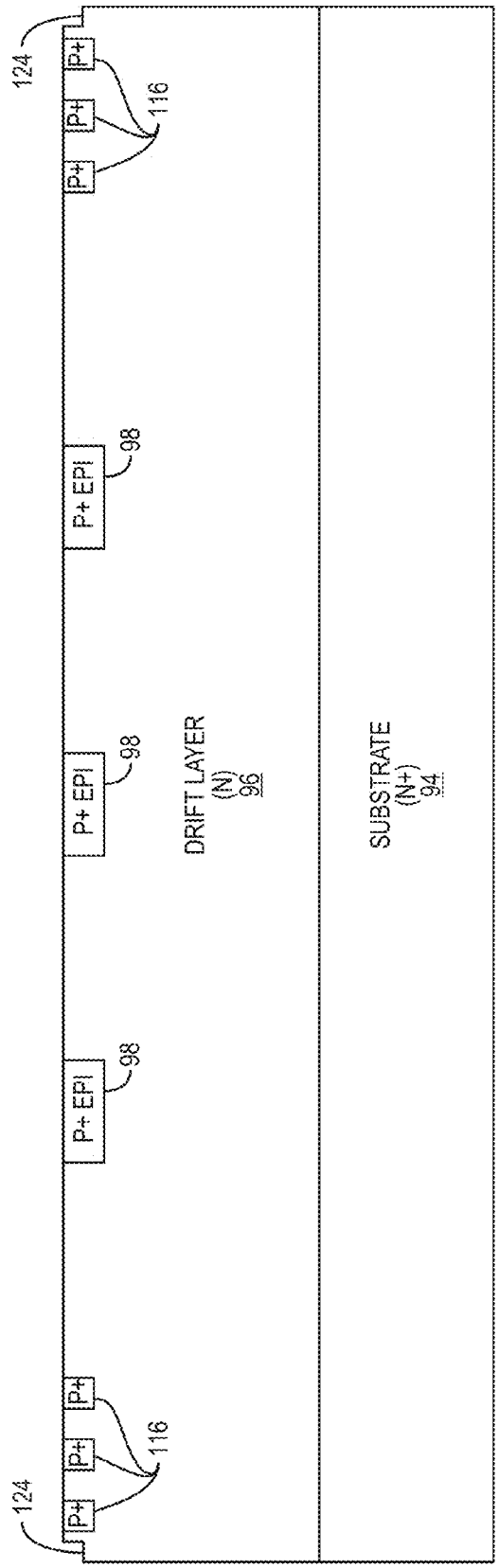

A chemical mechanical polishing process, or similar process, is then performed to remove an upper portion of the P+ epi layer 126 to expose the surface of the drift layer 96 while leaving portions of the P+ epi layer 126 in the recesses 122 to thereby create the epitaxial JBS regions 98, as illustrated in FIG. 12D. In general, a depth of the epitaxial JBS regions 98, as defined by the depth of the recesses 122, is sufficient to provide a desired amount of protection for the Schottky junction 108 (FIG. 11). In one embodiment, the depth of the epitaxial JBS regions 98 is at least 0.1 microns. In another embodiment, a depth of the epitaxial JBS regions 98 is at least 0.3 microns. In another embodiment, a depth of the epitaxial JBS regions 98 is at least 0.5 microns. In yet another embodiment, a depth of the epitaxial JBS regions 98 is in the range of and including 0.1 to 1.5 microns, in a range of and including 0.3 to 1.5 microns, or in a range of and including 0.5 to 1.5 microns. Notably, the depth of the epitaxial JBS regions 98 may vary depending on the particular implementation. In addition, as also illustrated in FIG. 12D, the P+ guard rings 116 are formed by implanting P-type dopants into the surface of the drift layer 96 in the edge termination 102 (FIG. 11).

Figure 12E:
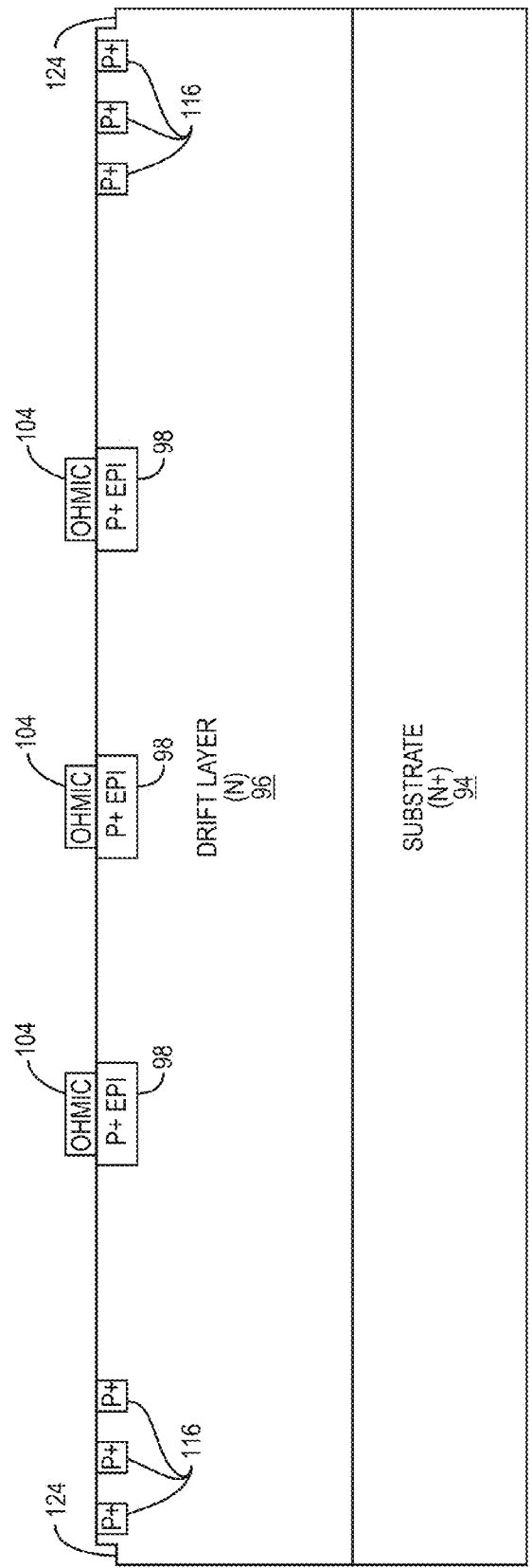
Figure 12F:
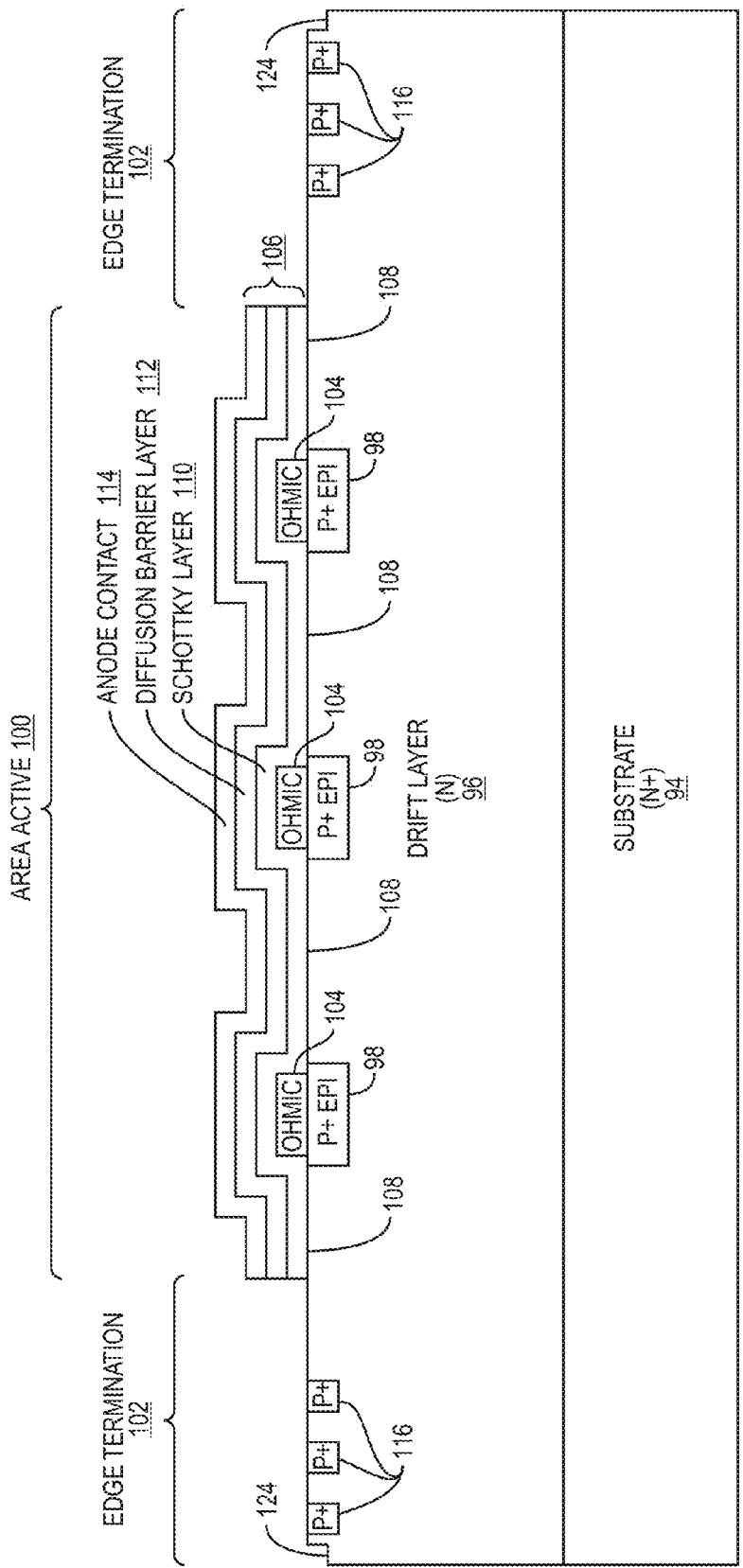

Next, as illustrated, in FIG. 12E, the ohmic layers 104 are formed on the surface of the epitaxial JBS regions 98. The ohmic layers 104 may be formed of an ohmic metal such as, for example, Ni, NiSi, or NiAl. Once the ohmic layers 104 are formed, the Schottky contact 106 is formed on a portion of the top surface of drift layer 96 over the epitaxial JBS regions 98 as well as on the top surface of the ohmic layers 104, as illustrated in FIG. 12F. The Schottky contact 106 includes the Schottky layer 110, optionally the diffusion barrier layer 112, and the anode contact 114. The thickness of the Schottky layer 110 will vary based on desired device characteristics and the metal used to form the Schottky layer 110, but will generally be between about 100 and 4500 Angstroms. For a 600 V device (i.e., a Schottky diode 92 having low reverse-bias leakage current up to a reverse-bias of 600 V), the Schottky layer 110 may be formed of Ta and be between about 200 and 1200 Angstroms, may be formed of Ti and be between about 500 and 2500 Angstroms, or may be formed of Al and be between about 3500 and 4500 Angstroms. Ta is associated with a very low barrier height, especially when used in combination with SiC to form a Schottky junction. Ta is also very stable against SiC.

Depending on the metal used for the Schottky layer 110 and the anode contact 114, one or more diffusion barrier layers 112 may be formed between the Schottky layer 110 and the anode contact 114. The diffusion barrier layer 112 may be formed of TiW, TiN, Ta, and any other suitable material, and may be between about 75 and 400 Angstroms thick in select embodiments. The diffusion barrier layer 112 helps prevent diffusion between the metals used to form the Schottky layer 110 and the anode contact 114. Notably, the diffusion barrier layer 112 is not used in certain embodiments where the Schottky layer 110 is Ta and the anode contact 114 is formed from Al. The diffusion barrier layer 112 is generally beneficial in embodiments where the Schottky layer 110 is Ti and the anode contact 114 is formed from Al.

The anode contact 114 is formed over the Schottky layer 110, or if present, the diffusion barrier layer 112. The anode contact 114 is generally relatively thick, formed from a metal, and acts as a bond pad for the anode of the Schottky diode 92. The anode contact 114 may be formed from Al, Au, Ag, or the like.

While not illustrated, an encapsulant layer is generally then formed over at least the exposed surfaces of the anode contact 114 and any exposed surface of the drift layer 96. The encapsulant layer may be a nitride, such as SiN, and acts as a conformal coating to protect the underlying layers from adverse environmental conditions. For further protection against scratches or like mechanical damage, a polyimide layer may be provided over the encapsulant layer.

Figure 12G:
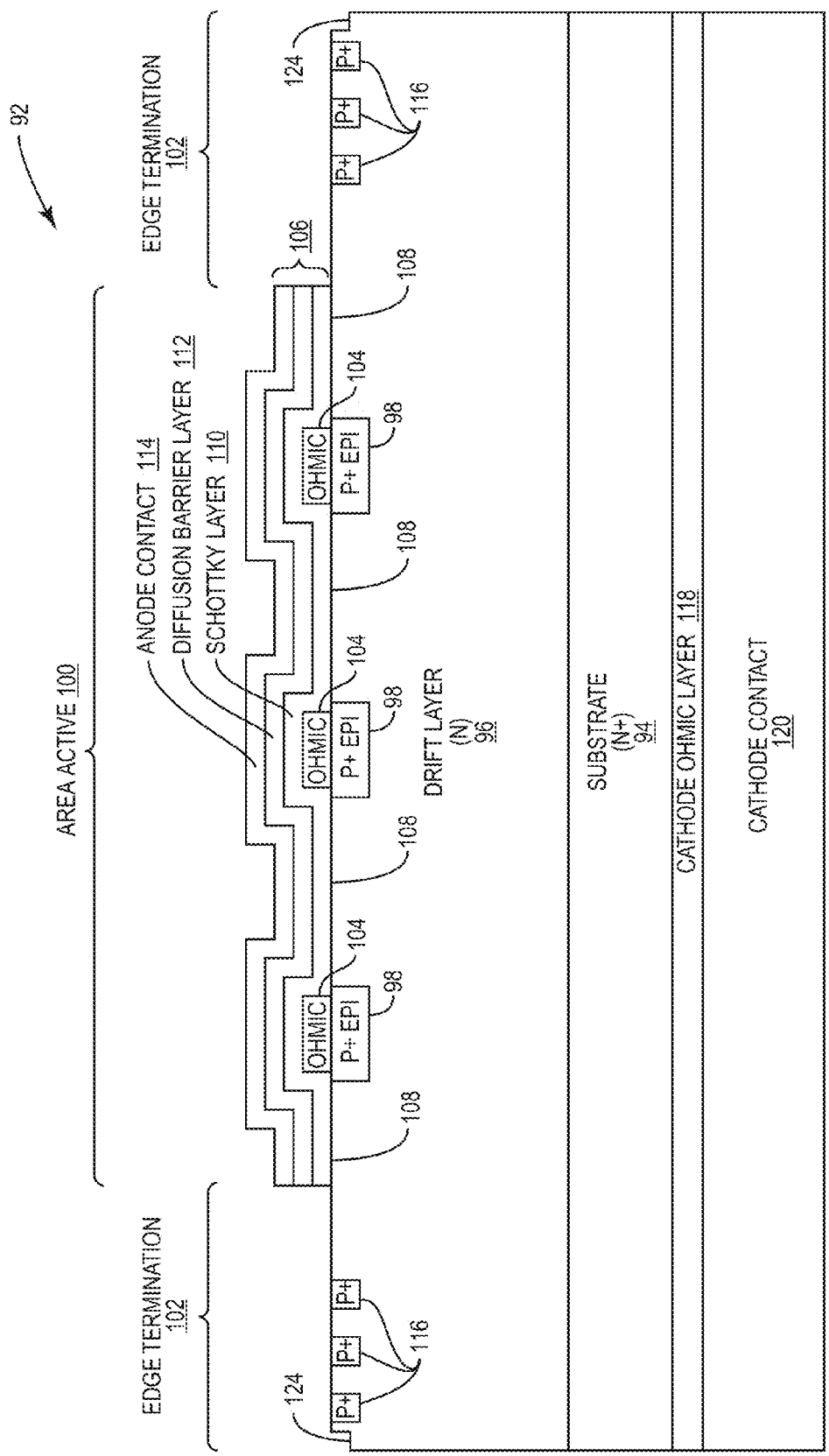

At this point, processing switches from the front side (top) of the Schottky diode 92 to the back side (bottom) of the Schottky diode 92. As illustrated in FIG. 12G, the substrate 94 is substantially thinned by removing a bottom portion of the substrate 94 though a grinding, etching, or like process. For a 600 V Schottky diode 92, the substrate 94 may be thinned to a thickness between about 50 and 200 microns in a first embodiment, and between about 75 and 125 microns in a second embodiment. Thinning the substrate 94 or otherwise employing a thin substrate 94 reduces the overall electrical and thermal resistance between the anode and cathode of the Schottky diode 92 and allows the device to handle higher current densities without overheating.

Finally, as also illustrated in FIG. 12G, the cathode ohmic layer 118 is formed on the bottom of the substrate 94 with an ohmic metal, such as Ni, NiSi, and NiAl. In embodiments where a polyimide layer is employed, the cathode ohmic layer 118 may be laser annealed instead of baking the entire device at a high temperature to anneal the ohmic metal. Laser annealing allows the ohmic metal to be heated sufficiently for annealing, yet does not heat the rest of the device to temperatures that would otherwise damage or destroy the polyimide layer. Once the cathode ohmic layer 118 is formed and annealed, the cathode contact 120 is formed over the cathode ohmic layer 118 to provide a solder or like interface for the Schottky diode 92, as also illustrated in FIG. 12G.

With the concepts disclosed herein, Schottky diodes 52, 92 may be designed for various applications that require both super surge capability and low reverse-bias leakage current. However, it should be noted that the concepts disclosed herein are not limited to Schottky diodes. In general, the concepts disclosed herein are equally applicable to a Schottky contact for any type of semiconductor device such as, for example, a MOSFET.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor device comprising:
    a drift layer of a first conductivity type, the drift layer comprising:
        a plurality of junction barrier shield element recesses in the drift layer within an active region of the drift layer; and
        a plurality of implant regions extending into the drift layer from corresponding ones of the plurality of junction barrier shield element recesses, the plurality of implant regions being of a second conductivity type that is opposite the first conductivity type;
    an epitaxial surge current injection region on the drift layer adjacent to the plurality of junction barrier shield element recesses;
    a Schottky layer on the drift layer to form a Schottky junction between the Schottky layer and the drift layer; and
    an ohmic layer on a surface of the epitaxial surge current injection region opposite the drift layer, wherein the Schottky layer further extends over a surface of the ohmic layer opposite the epitaxial surge current injection region.

2. The semiconductor device of claim 1 wherein a depth of each of the plurality of junction barrier shield element recesses is greater than or equal to 0.5 microns, and an additional depth of the plurality of implant regions is greater than or equal to 0.2 microns.

3. The semiconductor device of claim 1 wherein the drift layer is formed of Silicon Carbide.

4. The semiconductor device of claim 1 wherein the semiconductor device is a Schottky diode.

5. The semiconductor device of claim 1 wherein the semiconductor device is a Silicon Carbide Schottky diode.

6. The semiconductor device of claim 1 wherein the semiconductor device is a Silicon Carbide Schottky diode capable of conducting at least 10 times a rated current of the Schottky diode while maintaining a power density of less than 300 Watts per square centimeter.

7. The semiconductor device of claim 1 wherein a depth of each of the plurality of junction barrier shield element recesses is greater than or equal to 0.3 microns, and an additional depth of the plurality of implant regions is greater than or equal to 0.2 microns.

8. The semiconductor device of claim 1 wherein the Schottky layer further extends over a surface of the epitaxial surge current injection region opposite the drift layer.

9. The semiconductor device of claim 8 further comprising an anode contact on a surface of the Schottky layer.

10. The semiconductor device of claim 9 further comprising a diffusion barrier layer on the surface of the Schottky layer between the Schottky layer and the anode contact.

11. The semiconductor device of claim 1 wherein a turn-on voltage of a p-n junction formed between the epitaxial surge current injection region and the drift layer is greater than a turn-on voltage of the Schottky junction between the Schottky layer and the drift layer.

12. The semiconductor device of claim 11 wherein the turn-on voltage of the p-n junction formed between the epitaxial surge current injection region and the drift layer is such that the p-n junction formed between the epitaxial surge current injection region and the drift layer turns on when the semiconductor device is under a surge condition where a forward voltage of the semiconductor device is greater than a predefined threshold voltage.

13. The semiconductor device of claim 12 wherein the predefined threshold voltage is greater than a forward voltage of the semiconductor device at a rated current of the semiconductor device.

14. A semiconductor device comprising:
a drift layer of a first conductivity type, the drift layer comprising:
a plurality of junction barrier shield element recesses in the drift layer within an active region of the drift layer, wherein a depth of each of the plurality of junction barrier shield element recesses is greater than or equal to 0.3 microns, and an additional depth of the plurality of implant regions is greater than or equal to 0.2 microns; and
a plurality of implant regions extending into the drift layer from corresponding ones of the plurality of junction barrier shield element recesses, the plurality of implant regions being of a second conductivity type that is opposite the first conductivity type;
an epitaxial surge current injection region on the drift layer adjacent to the plurality of junction barrier shield element recesses; and
a Schottky layer on the drift layer to form a Schottky junction between the Schottky layer and the drift layer.

15. The semiconductor device of claim 14 wherein a turn-on voltage of a p-n junction formed between the epitaxial surge current injection region and the drift layer is greater than a turn-on voltage of the Schottky junction between the Schottky layer and the drift layer, where the turn-on voltage of the p-n junction formed between the epitaxial surge current injection region and the drift layer is such that the p-n junction formed between the epitaxial surge current injection region and the drift layer turns on when the semiconductor device is under a surge condition where a forward voltage of the semiconductor device is greater than a predefined threshold voltage.

16. The semiconductor device of claim 14 wherein the semiconductor device is a Silicon Carbide Schottky diode capable of conducting at least 10 times a rated current of the Schottky diode while maintaining a power density of less than 300 Watts per square centimeter.

17. A method of fabricating a semiconductor device comprising: providing a drift layer of a first conductivity type;
forming an epitaxial surge current injection region on the drift layer and a plurality of junction barrier shield element recesses in the drift layer, the epitaxial surge current injection region being highly doped of a second conductivity type that is opposite the first conductivity type;
implanting a dopant of the second conductivity type into the plurality of junction barrier shield element recesses to thereby form a plurality of implant regions extending into the drift layer from corresponding ones of the plurality of junction barrier shield element recesses; and
forming a Schottky layer on the drift layer to thereby form a Schottky junction between the Schottky layer and the drift layer, wherein the Schottky layer extends over the plurality of junction barrier shield element recesses such that the plurality of implant regions form an array of junction barrier shield regions in the drift layer below the Schottky junction.

18. The method of claim 17 wherein forming the epitaxial surge current injection region on the drift layer and the plurality of junction barrier shield element recesses in the drift layer comprises:
forming an epitaxial layer of the second conductivity type on the drift layer;
etching a plurality of recesses into the epitaxial layer opposite the drift layer at locations that correspond to desired locations for the plurality of junction barrier shield element recesses in the drift layer;
providing a mask on a portion of the epitaxial layer that corresponds to a desired region of the epitaxial layer to serve as the epitaxial surge current injection region; and
etching a portion of the epitaxial layer exposed by the mask to thereby form the epitaxial surge current injection region and the plurality of junction barrier shield element recesses on the drift layer.

19. The method of claim 18 wherein etching the plurality of recesses into the epitaxial layer comprises etching the plurality of recesses into the epitaxial layer while etching one or more alignment marks into the epitaxial layer.

20. A semiconductor device comprising:
a drift layer of a first conductivity type;
a plurality of epitaxial junction barrier shield regions located in a corresponding plurality of recesses in the drift layer, the plurality of epitaxial junction barrier shield regions being highly doped of a second conductivity type that is opposite the first conductivity type;
a Schottky layer on the drift layer to form a Schottky junction between the Schottky layer and the drift layer, wherein the Schottky layer extends over the plurality of epitaxial junction barrier shield regions such that the plurality of epitaxial junction barrier shield regions form an array of junction barrier shield regions within the drift layer below the Schottky junction; and
an ohmic layer on a surface of each epitaxial junction barrier shield region of the plurality of epitaxial junction barrier shield regions between the epitaxial junction barrier shield region and the Schottky layer.

21. The semiconductor device of claim 20 wherein the drift layer is formed of Silicon Carbide.

22. The semiconductor device of claim 20 wherein the semiconductor device is a Schottky diode.

23. The semiconductor device of claim 20 wherein the semiconductor device is a Silicon Carbide Schottky diode.

24. The semiconductor device of claim 20 wherein a turn-on voltage of p-n junctions formed between the plurality of epitaxial junction barrier shield regions and the drift layer is greater than a turn-on voltage of the Schottky junction between the Schottky layer and the drift layer.

25. The semiconductor device of claim 24 wherein the turn-on voltage of the p-n junctions formed between the plurality of epitaxial junction barrier shield regions and the drift layer is such that the p-n junctions formed between the plurality of epitaxial junction barrier shield regions and the drift layer turn on when the semiconductor device is under a surge condition where a forward voltage of the semiconductor device is greater than a predefined threshold voltage.

26. The semiconductor device of claim 25 wherein the predefined threshold voltage is greater than a forward voltage of the semiconductor device at a rated current of the semiconductor device.

27. The semiconductor device of claim 20 wherein a depth of each of the plurality of recesses is greater than or equal to 0.1 microns.

28. The semiconductor device of claim 20 further comprising an anode contact on a surface of the Schottky layer.

29. The semiconductor device of claim 28 further comprising a diffusion barrier layer on the surface of the Schottky layer between the Schottky layer and the anode contact.

* * * * *